(12) United States Patent
Watanabe et al.

(10) Patent No.: US 9,795,027 B2
(45) Date of Patent: Oct. 17, 2017

(54) PRINTED WIRING BOARD

(71) Applicant: FUJIKURA LTD., Tokyo (JP)

(72) Inventors: Hirohito Watanabe, Sakura (JP); Taiji Ogawa, Sakura (JP)

(73) Assignee: FUJIKURA LTD., Tokyo (JP)

( * ) Notice: Subject to any disclaimer, the term of this patent is extended or adjusted under 35 U.S.C. 154(b) by 213 days.

(21) Appl. No.: 14/717,280

(22) Filed: May 20, 2015

(65) Prior Publication Data

US 2015/0340751 A1    Nov. 26, 2015

(30) Foreign Application Priority Data

May 21, 2014   (JP) ................................ 2014-105106

(51) Int. Cl.
*H05K 1/02* (2006.01)
*H01P 3/08* (2006.01)
(Continued)

(52) U.S. Cl.
CPC ............. *H05K 1/0225* (2013.01); *H01P 3/08* (2013.01); *H05K 1/025* (2013.01); *H01P 1/022* (2013.01);
(Continued)

(58) Field of Classification Search
CPC .. H01P 1/022; H01P 3/08; H01P 3/081; H01P 3/085; H05K 1/0225; H05K 1/025;
(Continued)

(56) References Cited

U.S. PATENT DOCUMENTS

| | | | |
|---|---|---|---|
| 6,590,466 B2* | 7/2003 | Lin | ...................... H05K 1/0224 333/1 |
| 2001/0010270 A1 | 8/2001 | Lin et al. | |
| 2001/0010271 A1 | 8/2001 | Lin et al. | |

FOREIGN PATENT DOCUMENTS

| | | |
|---|---|---|
| JP | 2000-77802 A | 3/2000 |
| JP | 2003-152290 A | 5/2003 |
| JP | 2005-175078 A | 6/2005 |

OTHER PUBLICATIONS

Japanese Office Action for JP 2014-105106 dated Aug. 26, 2014.
Office Action issued in corresponding Chinese Application No. 201510262866.4 dated Jun. 26, 2017 (9 pages).

* cited by examiner

*Primary Examiner* — Benny Lee
*Assistant Examiner* — Jorge Salazar, Jr.
(74) *Attorney, Agent, or Firm* — Osha Liang LLP

(57) ABSTRACT

To suppress occurrence of a difference in transmission time due to a difference in length between signal lines, there is provided a printed wiring board having: an insulating substrate (10); a first signal line (L31) formed on the insulating substrate (10); a second signal line (L32) having a shorter length than that of the first signal line (L31); and a ground layer (30) formed for the first signal line (L31) and the second signal line (L31) via an insulating material (10). The ground layer (30) includes a first ground layer (G31) corresponding to a first region (D1) and a second ground layer (G32) corresponding to a second region (D2). The first region (D1) is defined based on the first signal line (L31) and has a first predetermined width (W31). The second region (D2) is defined based on the second signal line (L32) and has a second predetermined width (W32). The first ground layer (G31) has a remaining ratio lower than a remaining ratio of the second ground layer (G32).

6 Claims, 21 Drawing Sheets

(51) Int. Cl.
  *H01P 1/02* (2006.01)
  *H05K 1/03* (2006.01)
(52) U.S. Cl.
  CPC ............ *H01P 3/085* (2013.01); *H05K 1/0393* (2013.01); *H05K 2201/0715* (2013.01); *H05K 2201/09027* (2013.01); *H05K 2201/09681* (2013.01); *H05K 2201/09727* (2013.01)
(58) Field of Classification Search
  CPC ......... H05K 1/0393; H05K 2201/0715; H05K 2201/09027; H05K 2201/09681; H05K 2201/09727
  USPC .................................. 333/1, 5, 12, 238, 246
  See application file for complete search history.

FIG. 5

| MESH DESIGN | | | V/V0 | | | | | |
|---|---|---|---|---|---|---|---|---|
| GROUND LAYER REMAINING RATIO [%] | ML [μm] | MS [μm] | $Z_0=50\,\Omega$ SIGNAL LINE CIRCUIT WIDTH L [μm] | GROUND LAYER EXTRACTION WIDTH (REGION WIDTH) [μm] | | | | |
| | | | | L×1 | L×2 | L×3 | L×5 | L×7 | L×9 |
| 100 | 150 | 0 | 80 | 1.000 | 1.000 | 1.000 | 1.000 | 1.000 | 1.000 |
| 75 | 150 | 150 | 95 | 1.007 | 1.014 | 1.022 | 1.022 | 1.022 | 1.022 |
| 56 | 150 | 300 | 130 | 1.026 | 1.051 | 1.077 | 1.077 | 1.077 | 1.077 |
| 44 | 150 | 450 | 190 | 1.053 | 1.105 | 1.158 | 1.158 | 1.158 | 1.158 |
| 36 | 150 | 600 | 240 | 1.084 | 1.168 | 1.252 | 1.252 | 1.252 | 1.252 |
| 31 | 150 | 750 | 290 | 1.113 | 1.225 | 1.338 | 1.338 | 1.338 | 1.338 |
| 27 | 150 | 900 | 350 | 1.134 | 1.268 | 1.403 | 1.403 | 1.403 | 1.403 |

Note: table header shows six L× columns (L×1, L×2, L×3, L×5, L×7, L×9).

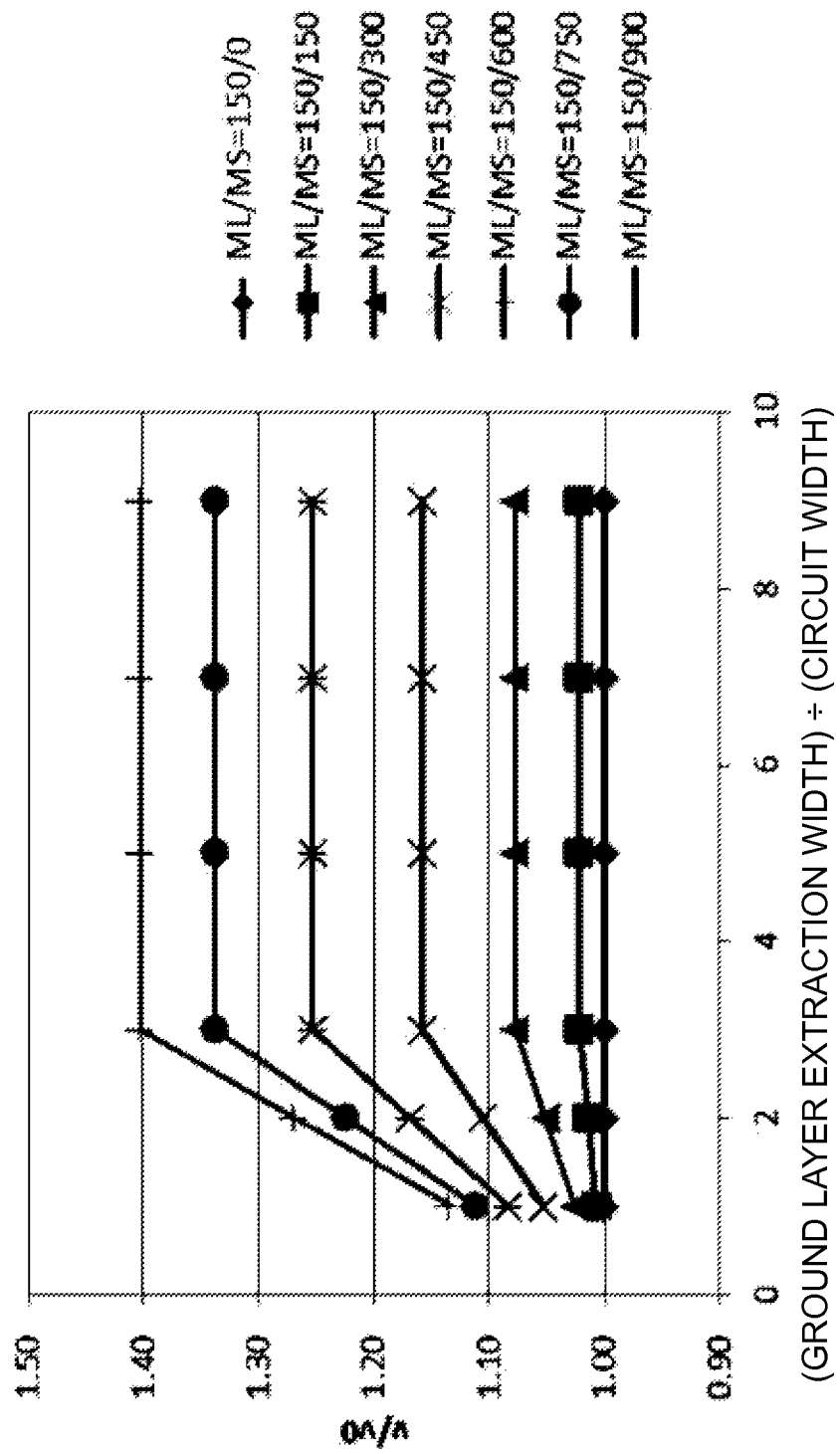

FIG. 9

| MESH DESIGN | | | | V/V0 | | | | | | |
|---|---|---|---|---|---|---|---|---|---|---|
| GROUND LAYER REMAINING RATIO [%] | LL[μm] | LS[μm] | Z₀=50Ω SIGNAL LINE CIRCUIT WIDTH L [μm] | GROUND LAYER EXTRACTION WIDTH (REGION WIDTH) [μm] | | | | | | |
| | | | | L×1 | L×2 | L×3 | L×5 | L×7 | L×9 | |
| 100 | 500 | 0 | 75 | 1.000 | 1.000 | 1.000 | 1.000 | 1.000 | 1.000 | |
| 75 | 375 | 125 | 90 | 1.004 | 1.008 | 1.011 | 1.011 | 1.011 | 1.011 | |
| 56 | 278 | 222 | 125 | 1.022 | 1.044 | 1.066 | 1.066 | 1.066 | 1.066 | |
| 44 | 219 | 281 | 185 | 1.049 | 1.098 | 1.146 | 1.146 | 1.146 | 1.146 | |
| 36 | 180 | 320 | 235 | 1.080 | 1.160 | 1.240 | 1.240 | 1.240 | 1.240 | |
| 31 | 153 | 347 | 285 | 1.108 | 1.216 | 1.324 | 1.324 | 1.324 | 1.324 | |
| 27 | 133 | 367 | 345 | 1.130 | 1.259 | 1.389 | 1.389 | 1.389 | 1.389 | |

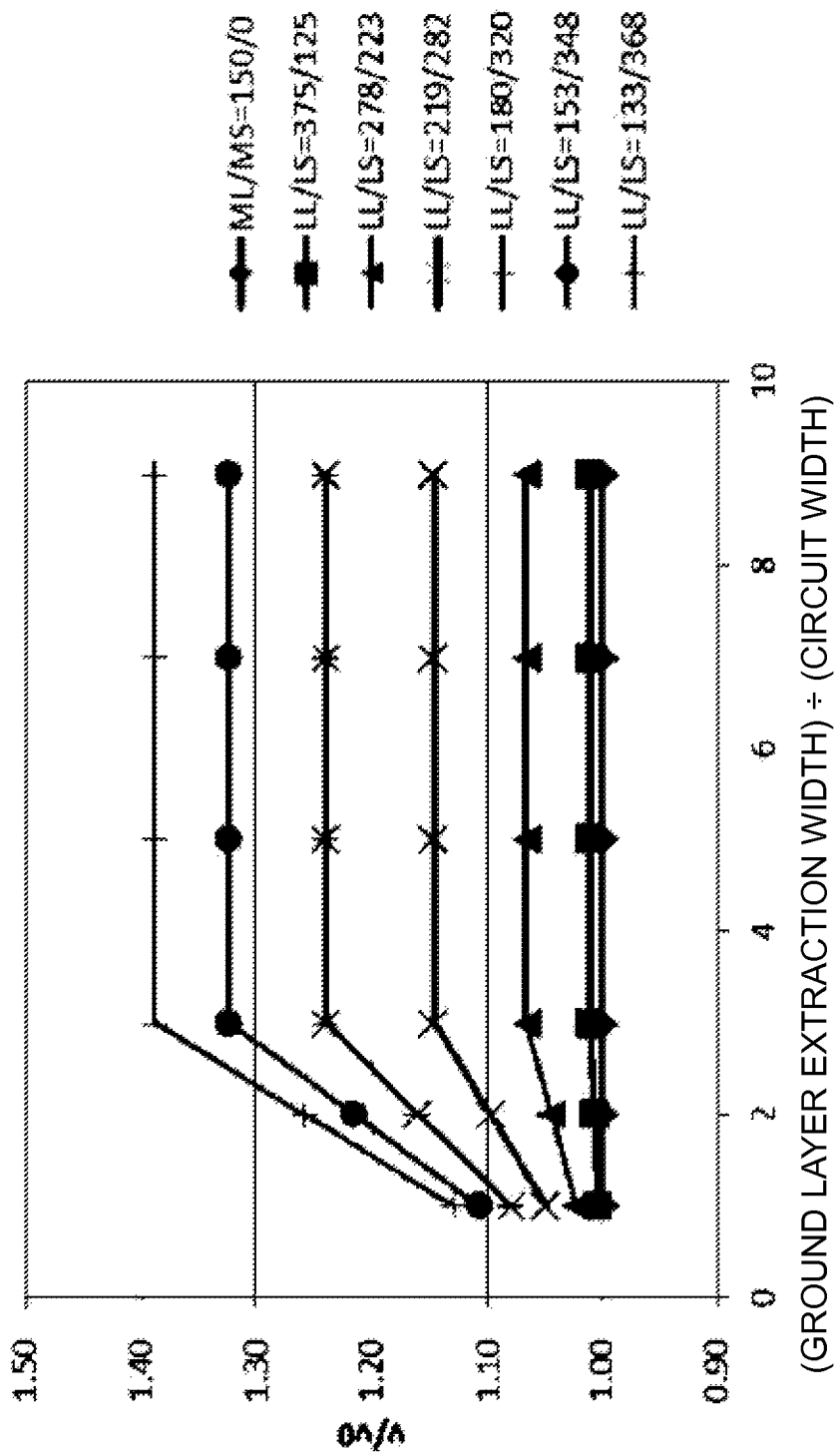

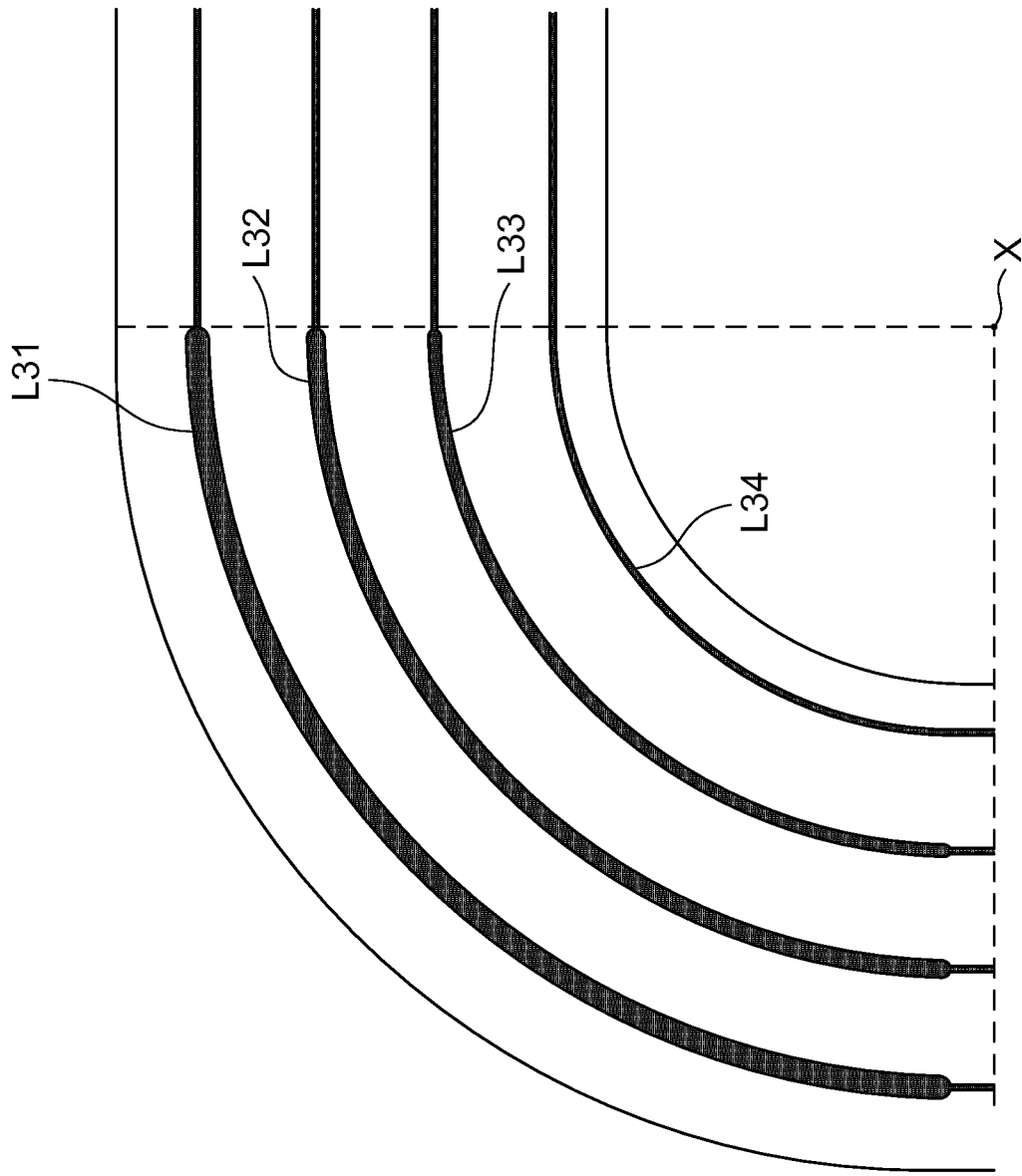

FIG. 14

| SIGNAL LINE | CURVATURE RADIUS [mm] | CIRCUIT WIDTH [μm] | MESH DESIGN | | |
|---|---|---|---|---|---|
| | | | GROUND LAYER REMAINING RATIO [%] | LL[μm] | LS[μm] |
| L34 | 5.0 | 75 | 100 | — | — |
| L33 | 5.5 | 148 | 49 | 247 | 253 |
| L32 | 6.0 | 212 | 39 | 195 | 305 |
| L31 | 6.5 | 278 | 32 | 160 | 340 |

PRINTED WIRING BOARD

CROSS REFERENCE TO RELATED APPLICATIONS

This application claims priority based on Japanese Patent Application No. 2014-105106 filed May 21, 2014, the contents of which are incorporated herein by reference in their entirety.

BACKGROUND OF THE INVENTION

1. Field of the Invention

The present invention relates to a printed wiring board.

2. Description of the Related Art

In general, when a difference in length exists between signal lines, the transmission quality deteriorates because the transmission time of signal also differs between the signal lines.

As a relevant technique, there has been known a technique in which, in order to make the same the signal delay time in a plurality of signal lines, the length of each signal line is adjusted by forming an elongated wiring portion for bypass depending on the signal delay time (Patent Document 1: JP 2003-152290 A).

Patent Document 1: JP 2003-152290 A

SUMMARY OF THE INVENTION

According to the prior art, however, the elongated wiring portion for bypass has to be additionally formed to adjust the length of a signal line, and a space is necessary for additional circuit formation. This conflicts with the demand for reduction in size, which is problematic.

An object of the present invention is to provide a printed wiring board which suppresses the occurrence of a difference in transmission time of signals without forming an additional elongated wiring portion for bypass to adjust the length of a signal line, thereby to achieve high transmission quality.

(1) According to an aspect of the present invention, the above object is achieved by providing a printed wiring board comprising: an insulating substrate; a first signal line formed on the insulating substrate; a second signal line having a shorter length than that of the first signal line; and a ground layer formed for the first signal line and the second signal line via an insulating material. The ground layer includes a first ground layer corresponding to a first region and a second ground layer corresponding to a second region. The first region is defined based on a position of the first signal line and has a first predetermined width. The second region is defined based on a position of the second signal line and has a second predetermined width. The first ground layer has a remaining ratio lower than a remaining ratio of the second ground layer.

(2) In the above invention, the above object is achieved by providing a printed wiring board in which: the first signal line includes a curved portion; and the second signal line is provided inside the curved portion of the first signal line.

(3) In the above invention, the above object is achieved by providing a printed wiring board in which: the first signal line includes a straight portion; and in the straight portion of the first signal line, the remaining ratio of the first ground layer corresponding to the first region which is defined based on the position of the first signal line and has the first predetermined width is lower than the remaining ratio of the second ground layer corresponding to the second region which is defined based on the position of the second signal line provided side by side with the first signal line and has the second predetermined width.

(4) In the above invention, the above object is achieved by providing a printed wiring board in which the circuit width of the first signal line is larger than the circuit width of the second signal line.

(5) In the above invention, the above object is achieved by providing a printed wiring board in which the width of the first region is larger than the width of the second region.

(6) In the above invention, the above object is achieved by providing a printed wiring board in which each of the first ground layer and the second ground layer has a mesh structure in which a plurality of partial regions are discretely removed so that a remaining region constitutes the mesh structure.

(7) In the above invention, the remaining ratio of each of the first ground layer and the second ground layer having the mesh structure can be defined by a width of the remaining region and a width of each removed partial region.

According to the present invention, the remaining ratio of the first ground layer corresponding to the first signal line is lower than the remaining ratio of the second ground layer corresponding to the second signal line having a shorter length than that of the first signal line, so that the transmission speed in the first signal line having a relatively long length can be relatively fast, or the transmission speed in the second signal line having a relatively short length can be relatively slow. This allows input signals to be output without transmission time difference, without forming an additional line to adjust the length of a signal line, even when signal lines having different lengths are used. As a result, a printed wiring board having high transmission quality can be provided.

BRIEF DESCRIPTION OF THE DRAWINGS

FIG. 5 is a table showing a relationship between each mesh design and the transmission speed ratio of a signal and a relationship between each mesh design and the circuit width in the first embodiment of the present invention;

FIG. 6 is a graph showing a relationship between the width of the ground layer and the transmission speed ratio of a signal in the first embodiment of the present invention;

FIG. 9 is a table showing a relationship between each mesh design and the transmission speed ratio of a signal and a relationship between each mesh design and the circuit width in the second embodiment of the present invention;

FIG. 10 is a graph showing a relationship between the width of the ground layer and the transmission speed ratio of a signal in the second embodiment of the present invention;

FIG. 12 is an enlarged view of region XII shown in FIG. 11A;

FIG. 14 is a table showing an example of each mesh design in the third embodiment of the present invention.

DESCRIPTION OF THE PREFERRED EMBODIMENTS

First Embodiment

A first embodiment of the present invention will hereinafter be described with reference to the drawings. In the present embodiment, examples will be described in which a printed wiring board 1 according to the present invention may be applied to transmission lines that connect between circuits in a device, between a circuit and a device, or between devices. The printed wiring board 1 according to the present invention is suitable for transmission of high speed signals and can perform transmission of signals based on various standards, such as LVDS, MIPI, HDMI (registered trademark) and USB.

Figure 1A:
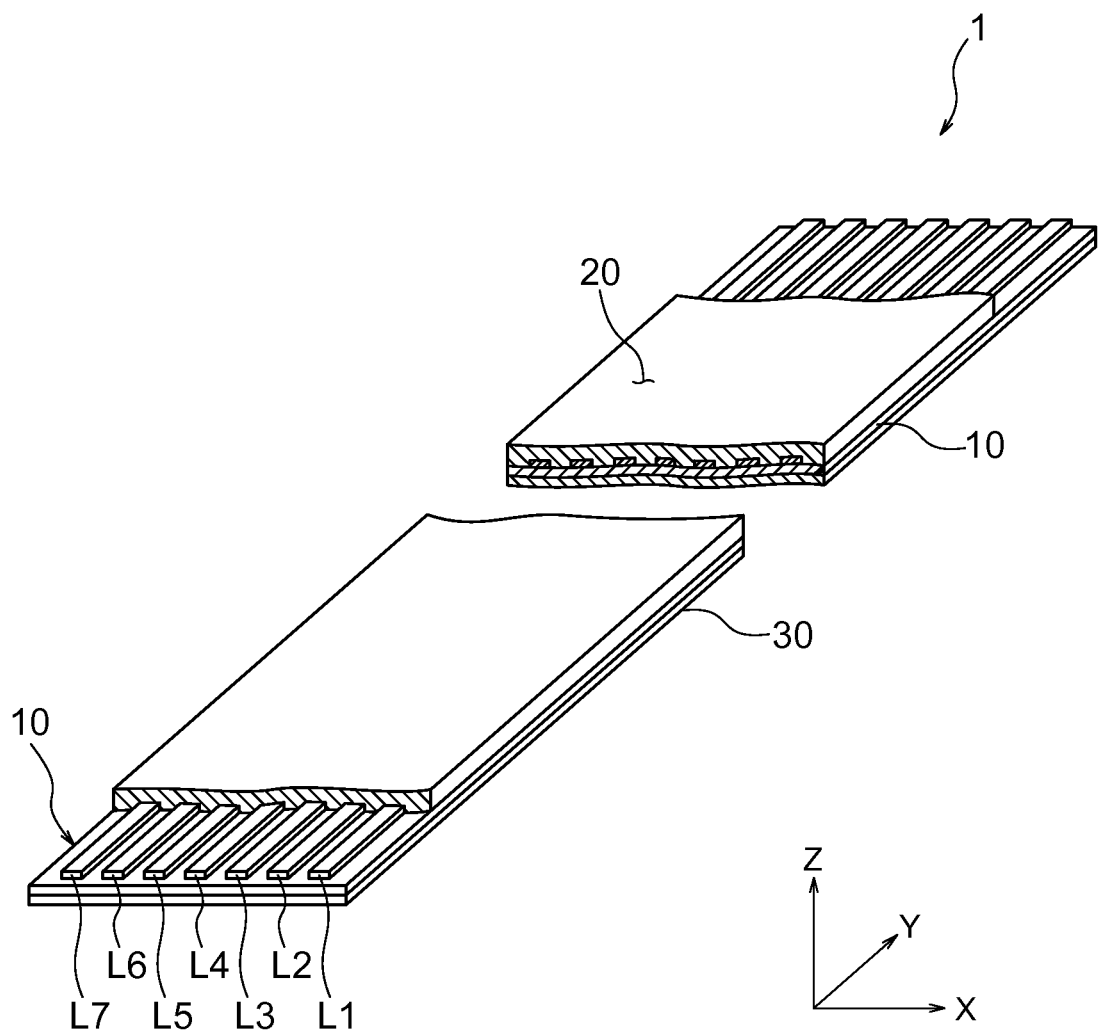
FIG. 1A is a perspective view viewed from the upper surface side when a part of a protective layer is removed from a printed wiring board according to an embodiment of the present invention.
Figure 1B:
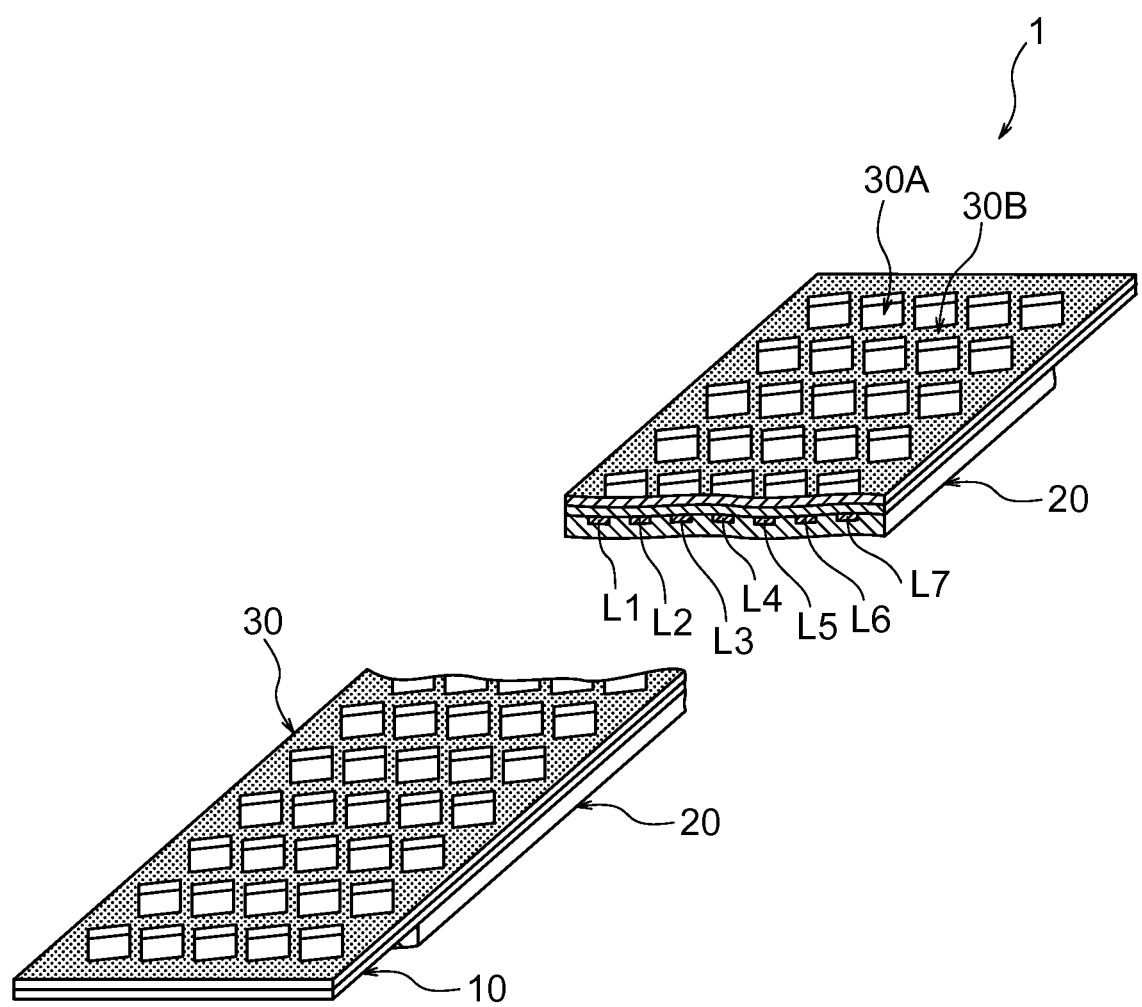
FIG. 1B is a perspective view, viewed from the lower surface side, of the printed wiring board according to an embodiment of the present invention.

FIG. 1A is a perspective view, viewed from one main surface side, of a state in which a part of a protective layer 20 is removed from the printed wiring board 1 according to the embodiment, while FIG. 1B is a perspective view, viewed from the other main surface side, of the printed wiring board 1 shown in FIG. 1A.

As shown in FIG. 1A, signal lines L1 to L7 are provided on a main surface (surface at the positive side of the Z-axis in the figure) of an insulating substrate 10 to extend along the Y-axis in the figure. In the present embodiment, among signal lines that constitute the signal lines L1 to L7, any one signal line is referred to as a first signal line, while another signal line provided side by side with the first signal line is referred to as a second signal line. Although not shown, the signal lines L1 to L7 have different lengths from input ends for signals to output ends for signals. In the present embodiment, a signal line having a relatively long length is defined as the first signal line, while a signal line having s shorter length than that of the first signal line is defined as the second signal line. In the present embodiment, the length of a signal line is a length from the input end for signal to the output end for signal. The input end for signal and the output end for signal can be arbitrarily defined in accordance with the function which the printed wiring board of the present embodiment is to execute.

In the present embodiment, the length of the first signal line is longer than the length of the second signal line. The difference in length between the first signal line and the second signal line may result from the presence or absence of a curve or curves of the first signal line and the second signal line, the difference in the number of curves, or the difference in the curvature of curves, or may be caused by the difference in each pattern of the first and second signal lines. Each of the first signal line and the second signal line may be configured of a curved shape having a curvature or a straight shape, or may also be configured of a shape that includes a curved shape and a straight shape. When the first signal line includes a curve and the second signal line does not include a curve (is in a state of straight line), the first signal line may be longer than the second signal line. When the first signal line includes a curve having a first curvature radius and the second signal line includes a curve having a second curvature radius smaller than the first curvature radius, the first signal line may be longer than the second signal line.

In the present embodiment, a signal line located relatively outside at the curved portion may be defined as the first signal line, while a signal line located inside at the curved portion may be defined as the second signal line. In the present embodiment, the first signal line located outside at the curved portion is longer than the second signal line located inside at the curved portion. Even when each of the first signal line and the second signal line has a plurality of curves, the first signal line may be located relatively outside at any one of the curves, and the second signal line may be located relatively inside at the curve.

As will be understood, the first signal line and the second signal line according to the present embodiment can constitute a pair of differential signal lines that perform differential signaling. That is, one signal line of pared differential signal lines may be the first signal line, while the other signal line that is located inside the first signal line and pared with the first signal line may be the second signal line.

Although not shown in the figure, the signal lines L1 to L7 according to the present embodiment each include a curved portion at which the extending direction varies, and the signal line present outside at the curve is defined as the first signal line, while the signal line present inside at the curve is defined as the second signal line. For example, when a degree of curving of each signal line can be expressed as a curvature, the signal line present at the side of the center of curvature is the second signal line, while the signal line present at a relatively separate outside position from the center of curvature is the first signal line. In addition, although not shown in the figure, the signal lines L1 to L7 according to the present embodiment have straight portions that merge into the curved portions and are located at the upstream side and/or the downstream side of the curved portions. Each straight portion merging into the curved portion of the first signal line is a straight portion of the first signal line, while each straight portion merging into the curved portion of the second signal line is a straight portion of the second signal line. In the present embodiment, the curved portion refers to a portion at which the extending direction of the signal line varies, and the angle formed by the curved portion is not limited. The curved portion may be constituted of a curved segment or may also be constituted of straight segments connected at a vertex or at vertices.

In the present description, hereinafter, the signal lines L1 to L7 and other signal lines including the first signal lines and the second signal lines may also be referred to as "signal lines L100" in a collective term. The first signal line or lines may also be referred to as "first signal line(s) L110" in a collective term, and the second signal line or lines may also be referred to as "second signal line(s) L120" in a collective term.

As shown in FIG. 1A, the printed wiring board 1 according to the present embodiment comprises: signal lines L1 to L7 formed at the side of one main surface of an insulating substrate 10; a protective layer 20 that covers the signal lines L1 to L7; and a ground layer 30 formed at the side of the other main surface of the insulating substrate 10. The printed wiring board 1 according to the present embodiment has a so-called microstrip line structure. The insulating substrate is interposed between the ground layer 30 and the signal lines L1 to L7.

The structure of the printed wiring board 1 according to the present embodiment is not limited to that shown in FIG. 1A. The printed wiring board 1 according to the present embodiment may also be configured as a so-called strip line structure that comprises: signal lines L1 to L7 formed at the side of one main surface of an insulating substrate 10; a protective layer (insulating layer) 20 that covers the signal lines L1 to L7; a ground layer (not shown) provided at the side of opened main surface of the protective layer (insulating layer) 20; and a ground layer 30 formed at the side of the other main surface of the insulating substrate 10. The signal lines L1 to L7 may also be configured to be interposed between upper and lower ground layers (not shown) formed via insulating substrates.

The printed wiring board 1 according to the present embodiment may also be configured as a so-called coplanar line structure that comprises: signal lines L1 to L7 formed at the side of one main surface of an insulating substrate 10; ground lines (not shown) that are formed at the side of the one main surface of the insulating substrate 10 and provided side by side with the signal lines L1 to L7; a protective layer (insulating layer) 20 that covers the signal lines L1 to L7 and the ground lines. The signal lines L1 to L7 and the ground lines are formed on the same main surface of the insulating substrate 10, and the protective layer 20 (insulating substrate) is interposed therebetween.

As shown in FIG. 1B, the ground layer 30 is formed at the lower surface side of the insulating substrate 10 according to the present embodiment. The ground layer 30 according to the present embodiment has a mesh structure in which a plurality of partial regions 30A are discretely removed so that the remaining region 30B constitutes the mesh structure. FIG. 1B exemplifies an example in which the mesh structure is constituted as an inclined grid pattern, but the pattern (design) of the mesh structure is not particularly limited. The mesh structure may also be a longitudinal or lateral grid pattern from which rectangular partial regions 30A are removed, a honeycomb pattern from which hexagonal partial regions 30A are removed, or a dot pattern from which circular partial regions 30A are removed.

A method of manufacturing the printed wiring board 1 according to the present embodiment will be described briefly. A double-sided conductor-clad laminate L is first prepared. This double-sided conductor-clad laminate L is a sheet-like member in which foil of metal such as copper is attached to each of both main surfaces of an insulating substrate 10 such as a polyimide (PI) substrate via an adhesive layer. Examples of material to be used for the insulating substrate 10 include polyethylene terephthalate (PET), polyethylene naphthalate (PEN), polyester (PE), and liquid crystal polymer (LCP). The metal foil formed on the other main surface at the opposite side to the one main surface of the printed wiring board 1 functions as the ground layer 30. The ground layer 30 comprises a desired mesh structure formed via an etching step. The remaining ratio of the ground layer 30 is controlled to a desired value. Signal lines L100 (and ground lines if necessary) are formed on the one main surface of the printed wiring board 1 by removing predetermined regions using an ordinary photolithography method. Thereafter, the signal lines L100 (and ground lines if any) are laminated with a sheet-like protective layer 20 that covers the signal lines L100 (and ground lines if any), and the printed wiring board 1 according to the present embodiment is obtained through heat treatment.

The first embodiment will be described with reference to FIG. 2A to FIG. 2C for an example in which the mesh structure is an inclined grid pattern.

Figure 2A:
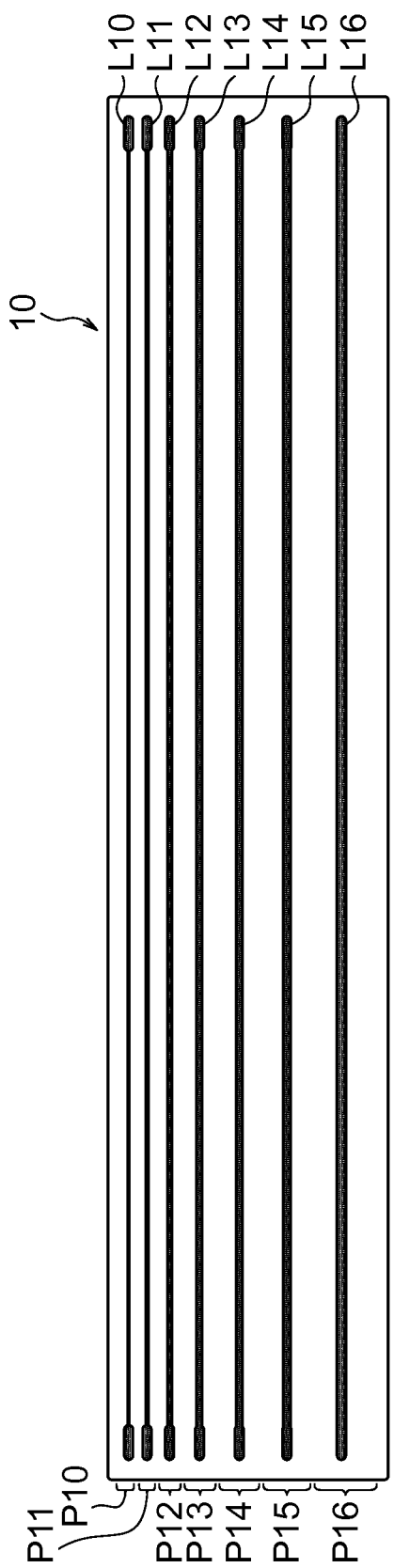
FIG. 2A is a plan view of an insulating substrate of which one main surface is formed with signal lines according to a first embodiment of the present invention, and shows examples of signal lines having different widths.
Figure 2B:
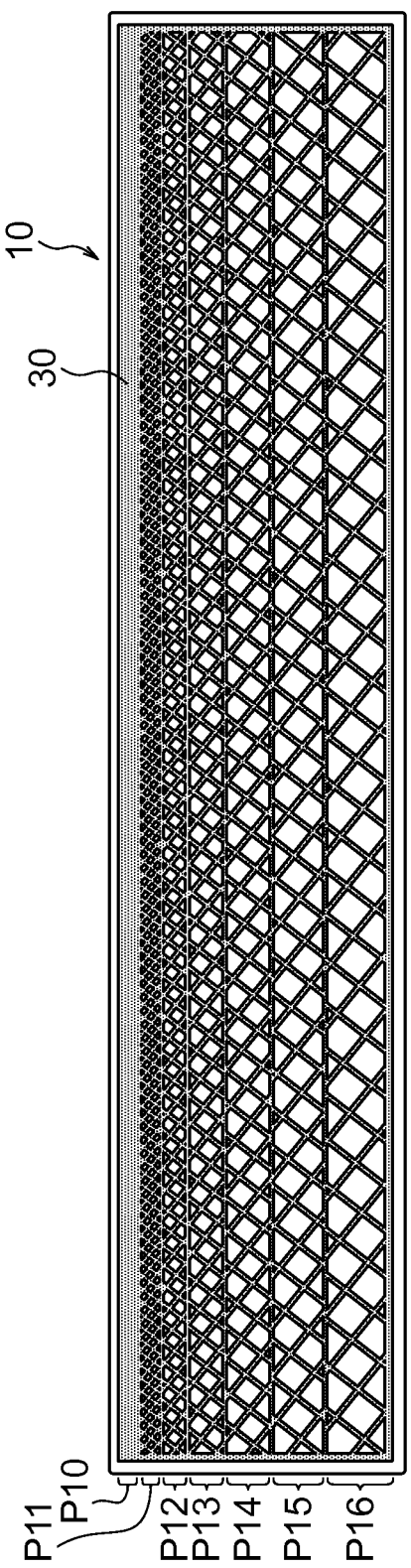
FIG. 2B is a plan view showing the lower surface side of the insulating substrate shown in FIG. 2A, and shows an example of a ground layer in which the remaining ratio and the region width vary.

FIG. 2A is a plan view, viewed from the side of one main surface, of an insulating substrate 10 formed with model signal lines L10 to L16 that are set up as models of signal lines in the first embodiment. As shown in FIG. 2A, the circuit width of each of the model signal lines L10 to L16 can have a different value. FIG. 2B is a plan view, viewed from the side of the other main surface, of the insulating substrate 10 formed with a ground layer 30 of an inclined grid pattern. FIG. 2C is a plan view of the insulating substrate 10 viewed from the side of the one main surface like in FIG. 2A, but with the ground layer 30 on the other main surface being transparently viewed. FIG. 2C represents the positional relationship between the model signal lines L10 to L16 and the ground layer 30. As shown in the figure, the model signal lines L10 to L16 are associated with regions P10 to P16 having respective predetermined widths determined based on the model signal lines L10 to L16.

As will be described later in detail, the remaining ratio of the ground layer 30 can be varied for a region (region D as will be described later) that corresponds to each of the regions P10 to P16 having respective predetermined widths based on the model signal lines L10 to L16. The region for which the remaining ratio is controlled is defined based on the position of each of the model signal lines L10 to L16. In the present embodiment, that region may be defined based on the position of any one first signal line L110 or any one second signal line L120 of the signal lines L100, or may be based on the center position between the first signal line L110 and the second signal line L120. The region D for which the remaining ratio is controlled is defined based on the position of a curved portion or a straight portion of each of the signal lines L100. Although not particularly limited, in the present embodiment, the region for which the remaining ratio of the ground layer 30 is controlled may be a region that includes only a curved portion, a region that includes only a straight portion, or a region that includes both of a curved portion and a straight portion. When controlling the remaining ratio of the ground layer 30 corresponding to a region that includes a curved portion, it is preferred that the region for which the remaining ratio is controlled is a region from one end of the curved portion at which the first signal line becomes not straight (the curvature becomes not zero) to the other end.

Figure 2C:
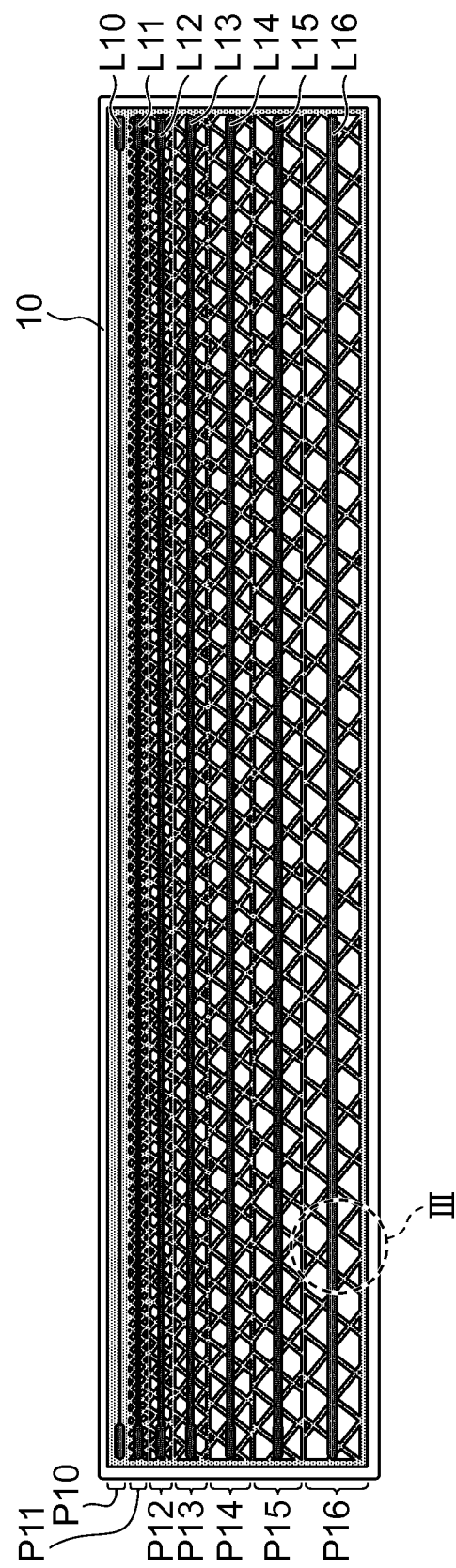
FIG. 2C is a plan view of the insulating substrate shown in FIG. 2A viewed from the side of the one main surface provided with the signal lines, but with the ground layer on the other main surface being transparently viewed.
Figure 3:
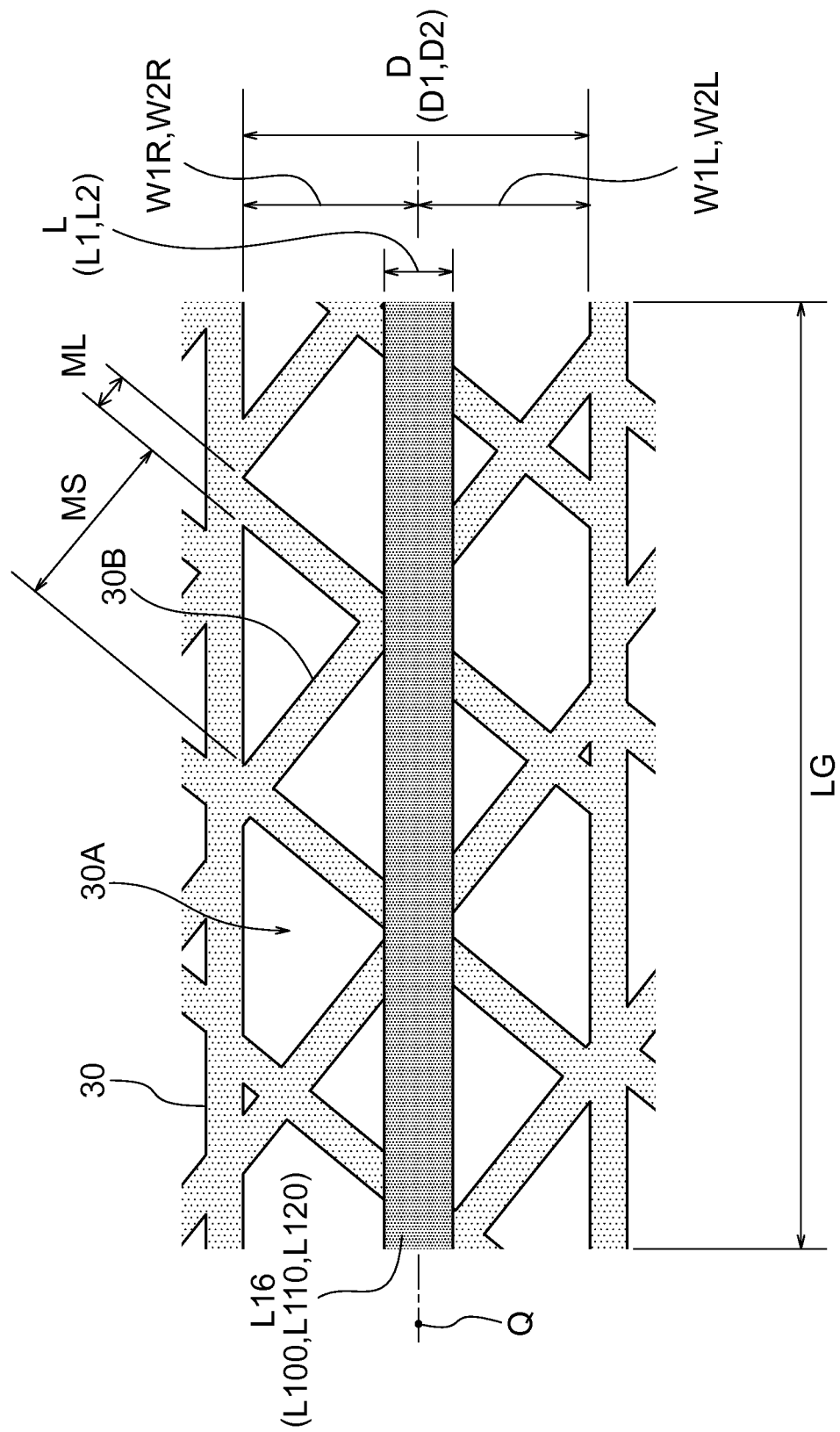
FIG. 3 is an enlarged view of region III shown in FIG. 2C.

FIG. 3 is an enlarged view of region III shown in FIG. 2C. The ground layer 30 shown in FIG. 3 has a mesh structure of an inclined grid pattern in which a plurality of partial regions 30A are discretely removed so that the remaining region 30B constitutes the mesh structure. Dashed line Q shown in FIG. 3 represents a reference position based on the position of the model signal line L16. In the present embodiment, a first region D1 is defined based on the position of the model signal line L16. For example, as shown in the figure, the first region D1 is defined based on the position Q which corresponds to the model signal line L16. The first region D1 for the ground layer 30 is defined by first predetermined widths W1R and W1L based on the position Q which corresponds to the model signal line L16. In the present embodiment, each position of the previously-described regions P10 to P16 is in common with the position of the first region D1 for the ground layer 30. The remaining ratio of the ground layer 30 corresponding to the first region D1 is controlled.

Descriptions regarding the model signal lines L10 to L16, in particular regarding the model signal line L16, can be applied to the signal lines L100 according to the present embodiment and the first signal lines L110 and the second signal lines L120 included in the signal lines L100.

In the present example, the first region D1 may be defined across both of right side and left side of each first signal line L110 (position Q), or may otherwise be defined at either side. The first predetermined width W1R at the right side of the first signal line L110 may have a different value from that of the first predetermined width W1L at the left side of the first signal line L110. When the distance between the first signal line L110 and the second signal line L120 is small, one of the right side and the left side of the first signal line L110 is provided with a narrow region while the other is provided with a wide region. Setting method for the first region D1 has been described herein, but the same method can be applied to set a second region D2.

According to the present embodiment, the ground layer 30 is formed such that the remaining ratio of a first ground layer 30 corresponding to the first region D1 is lower than the remaining ratio of a second ground layer 30 corresponding to the second region D2. The first region D1 is defined based on the position of each first signal line L110 and has the first predetermined widths W1R and W1L. The second region D2 is defined based on the position of each second signal line L120 and has the second predetermined widths W2R and W2L. The remaining ratio of the ground layer 30 can be controlled by a removal amount (removal ratio) of a conductor, such as copper, which functions as ground.

Descriptions will then be directed to a method of calculating the remaining ratio of the ground layer 30 according to the present embodiment. In the present embodiment, the remaining ratio of the first ground layer 30 having a mesh structure is defined by the width of a remaining region and the width of removed partial regions. According to the present embodiment, the ground layer 30 has a mesh structure thereby to allow the remaining ratio to be arbitrarily controlled using a method of removing the ground layer 30, such as etching. In particular, when the mesh structure of the ground layer 30 is configured with a regular graphical pattern, prediction of the remaining ratio can be readily performed, so that the ground layer 30 having a desired remaining ratio can be obtained through etching treatment. This allows the ground layer 30 to have any remaining ratio for each signal line.

With reference to FIG. 3, a method of calculating the remaining ratio of the ground layer 30 when the ground layer 30 has a mesh structure of an inclined grid pattern will be described. In the present embodiment, the remaining ratio of the ground layer 30 is defined as a ratio of a surface area occupied by the region 30B (light gray part in the figure) in which the conductor exists to the total surface area of a predetermined region of the insulating substrate 10 formed with the ground layer 30, i.e., the total of the region 30B in which the conductor exists and the regions 30A from which the conductor has been removed. The predetermined region D of the insulating substrate 10 formed with the ground layer 30 is defined by a length LG along the extending direction of the signal lines L100 and the predetermined widths W1L and W1R along the width direction of the signal lines. The length LG along the extending direction of the signal lines L100 is defined in accordance with a length of a curved portion, which is not shown in the present example. The predetermined widths W1L and W1R are defined based on the position Q at which each of the signal lines L100 is provided.

In the present embodiment, the remaining ratio of the ground layer 30 is calculated based on a circuit width ML to form the grid pattern shown in FIG. 3 and a width MS of the partial regions from which the conductor has been removed. That is, the remaining amount of the ground layer 30 is calculated from the circuit width ML to form the grid pattern, and the removal amount of the ground layer 30 is calculated from the width MS of the partial regions.

When the ground layer 30 has a mesh structure other than the inclined grid pattern, the surface area of the region in which the ground layer 30 remains and the surface area of the partial regions from which the ground layer 30 has been removed can be appropriately calculated using a geometric method. However, the method of calculating the remaining ratio of the ground layer 30 is not limited to such a geometric calculation method. The surface area of the region in which the ground layer 30 remains and the surface area of the partial regions from which the ground layer 30 has been removed may also be calculated based on features, such as color, on image data obtained by image analysis of an captured image via a camera.

Specifically, in the present embodiment, the remaining ratio of the ground layer 30 may be obtained using Equation 1 below, for example. The remaining ratio of the ground layer 30 corresponding to the first region based on each first signal line L110, and the remaining ratio of the ground layer 30 corresponding to the second region based on each second signal line L120, can be calculated by the same method.

$$\text{Remaining ratio}[\%]=[1-\{MS^2/(ML+MS)^2\}]\times 100 \quad (1)$$

In the present embodiment, the width of the first region D1 based on the first signal line L110 is larger than the width of the second region D2 based on the second signal line L120. As shown in FIG. 3, the remaining ratio is controlled in the ground layer 30 corresponding to the first region D1 which has a width defined by the predetermined widths W1R and W1L based on the position Q of the first signal line L110. Similarly, the remaining ratio is controlled in the ground layer 30 corresponding to the second region D2 which has a width defined by the predetermined widths W2R and W2L based on the position Q of the second signal line L120.

Figure 4:
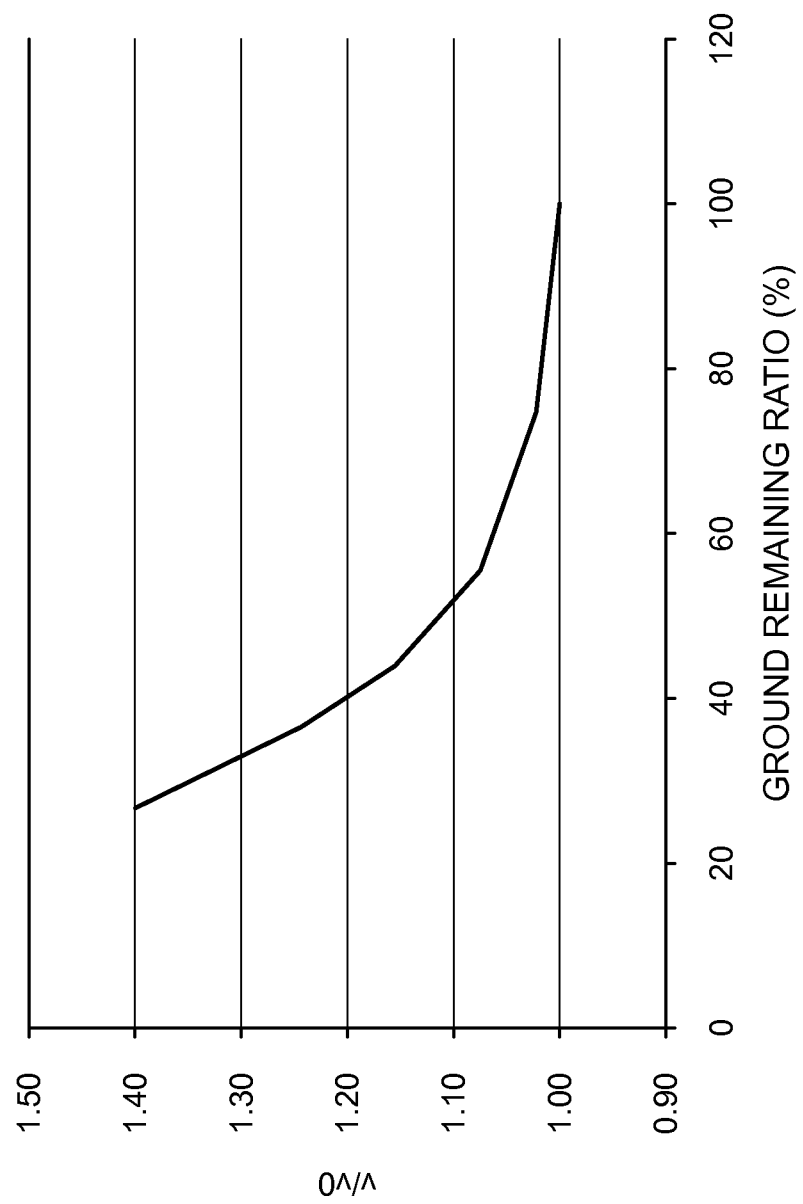
FIG. 4 is a graph showing a relationship between the remaining ratio of the ground layer and the transmission speed ratio of a signal.

FIG. 4 shows a relationship between the remaining ratio of the ground layer 30 and a transmission speed ratio of a signal. The transmission speed ratio is a ratio of a transmission speed to the transmission speed when the remaining ratio of the ground layer 30 is 100%, i.e., when no removed portions exist. As shown in FIG. 4, as the remaining ratio of the ground layer 30 decreases, the transmission speed ratio becomes high. In other words, there is a tendency that, as the remaining ratio of the ground layer 30 decreases, the transmission speed becomes high.

Impedance Z is given by $Z=\sqrt{(L/C)}$ using an inductance L and a capacitance C of a unit length of each of the signal lines L100. Transmission speed V of a signal can be represented by $V=1/\sqrt{(LC)}$. If the remaining ratio of a conductor of the ground layer 30 that exists in a position opposing the signal lines L100 is reduced, the capacitance C of a unit length of the signal lines L100 can be reduced, so that the transmission speed increases. Increasing the transmission speed V in such a manner can eliminate a delay in transmission time which is generated between signal lines having different physical lengths. As will be understood, it is preferred that the impedance Z is maintained at a fixed value.

According to the present embodiment, the remaining ratio of the ground layer 30 corresponding to the first signal line L110 having a relatively long circuit length is set lower than the remaining ratio of the ground layer 30 corresponding to the second signal line L120 shorter than the first signal line L110. In this manner, the transmission speed of a signal propagating in the first signal line L110 having a relatively long circuit length can be faster than the transmission speed of a signal propagating in the second signal line L120 having a relatively shorter circuit length than that of the first signal line L110. Since the first signal line L110 has a longer physical length than that of the second signal line L120, if the transmission speed of signals is the same, a difference (delay) in transmission time between the signals is generated depending on the difference in length between the signal lines. According to the present embodiment, such a difference in transmission time generated due to the difference in length between the signal lines is adjusted (controlled) using the remaining ratio of the ground layer 30. This can suppress the occurrence of a difference in transmission time between signals that are transmitted through a plurality of signal lines L100. As a result, a printed wiring board having high transmission quality can be provided.

In the present embodiment, treatment of making the remaining ratio of the ground layer 30 corresponding to the first signal line L110 lower than that corresponding to the second signal line L120 can be performed for any portion of the first signal line L110 and the second signal line L120. The above-described control of the remaining ratio of the ground layer may be performed for a portion at which a difference in length occurs between the first signal line L110 and the second signal line L120, or performed for a portion other than that portion. As will be understood, the control of the remaining ratio may be performed for both of a portion at which a difference in length occurs and a portion other than that portion. For example, the above-described control of the remaining ratio of the ground layer may be performed for a curved portion and/or for a straight portion.

It is preferred that the width of the ground layer 30 corresponding to the region D1 based on the first signal line L110 having a relatively long circuit length is set larger than the width of the ground layer 30 corresponding to the region D2 based on the second signal line L120 having a relatively short circuit length. In the present embodiment, the remaining ratio of the ground layer 30 corresponding to the first signal line L110 having a relatively long circuit length is relatively low. This region of the ground layer 30 having a low remaining ratio can be set relatively wide thereby to more reduce the existing ratio of the ground layer 30 corresponding to the first signal line L110. This allows the transmission speed to be relatively fast in the first signal line L110 which has a long physical length, so that the transmission time of a signal can be controlled.

According to the present embodiment, the remaining ratio of the ground layer 30 corresponding to the first signal line L110, which has a curved portion and is located outside, is set lower than the remaining ratio of the ground layer 30 corresponding to the second signal line L120 located inside the first signal line L110. In this manner, the transmission speed of a signal propagating in the first signal line L110, which has a curved portion and is located outside, can be controlled faster than the transmission speed of a signal propagating in the second signal line L120 located inside the first signal line L110. Since the first signal line L110, which includes a curved portion and is located outside, has a longer physical length than that of the second signal line L120, if the transmission speed of signals is the same, a difference (delay) in transmission time between the signals is generated depending on the difference in length between the signal lines. According to the present embodiment, such a difference in transmission time generated due to the difference in length between the signal lines is adjusted (controlled) using the remaining ratio of the ground layer 30. This can suppress the occurrence of a difference in transmission time between signals that are transmitted through a plurality of signal lines L100. As a result, a printed wiring board having high transmission quality can be provided.

In the present embodiment, treatment of making the remaining ratio of the ground layer 30 corresponding to the first signal line L110 lower than that corresponding to the second signal line L120 may be performed for curved portions of the first signal line L110 and the second signal line L120, or performed for straight portions of the first signal line L110 and the second signal line L120. Of course, the treatment may be performed for both of the curved portions and the straight portions.

It is preferred that the width of the ground layer 30 corresponding to the region D1 based on the first signal line L110 of which the curved portion is provided outside and which has a relatively long circuit length is larger than the width of the ground layer 30 corresponding to the region D2 based on the second signal line L120 of which the curved portion is provided inside and which has a relatively short circuit width. In the present embodiment, the remaining ratio of the ground layer 30 corresponding to the first signal line L110 provided outside at the curved portion is relatively low. This region of the ground layer 30 having a low remaining ratio can be set relatively wide thereby to more reduce the existing ratio of the ground layer 30 corresponding to the first signal line L110 provided outside at the curved portion. This allows the transmission speed to be relatively fast in the first signal line L110 which is provided outside at the curved portion and has a long physical length, so that the transmission time of a signal can be controlled.

It is preferred that the width W1R+W1L of the first region D1 based on the first signal line L110 is a natural number multiple of the circuit width L (L1) of the first signal line L110. In particular, it is preferred that the width of the first region D1 is three times or more of the circuit width L1 of the first signal line L110. Similarly, it is preferred that the width W2R+W2L of the second region D2 based on the second signal line L120 is a natural number multiple of the circuit width L (L2) of the second signal line L120. In particular, it is preferred that the width of the second region D2 is three times or more of the circuit width L2 of the second signal line L120. According to the present embodiment, the region from which parts of the ground layer 30 are extracted (removed) to configure a mesh structure having a predetermined remaining ratio has a width of three times or more of the circuit width L of the signal line. This allows the transmission speed ratio to be kept at a fixed value thereby to improve the transmission characteristics.

As described above, when the remaining ratio of the ground layer 30 is varied to adjust the transmission speed in the signal lines L100, the characteristic impedance of each of the signal lines L100 also varies. According to the present embodiment, therefore, the circuit widths L1 and L2 of the signal lines L100 are made large. According to the present embodiment, the circuit width (line width) L1 of the first signal line L110 is made larger than the circuit width (line width) L2 of the second signal line L120 because of adjusting the remaining ratio of the ground layer 30 corresponding to the first signal line L110 which includes a curved portion and is provided outside. This can suppress the variation in the impedance of the first signal line L110 caused due to the variation in the remaining ratio of the ground layer 30.

Working Example 1

A first working example of a wiring board according to the present embodiment will hereinafter be described.

A copper-clad laminate was prepared such that each main surface of a polyimide substrate of a thickness of 25 mm was laminated with copper foil of a thickness of 18 µm via an adhesive of a thickness of 10 µm. Holes for through-holes were opened in the copper-clad laminate using a drill of 0.15 mm. The through-holes were formed to connect ground pads GPs (see FIG. 11A) with a lower surface ground layer (see FIG. 11A, for example). Copper plating of 15 µm was formed on the copper foil surfaces and in the through-holes. Subsequently, etching was performed using photolithography method to form signal lines L100 at the side of one main surface of the copper-clad laminate and a ground layer 30 of a mesh structure on the other main surface. Furthermore, the copper foil-exposed part was attached, in an opened state, to a cover film comprising a polyimide substrate of a thickness of 12.5 µm and an adhesive of a thickness of 40 µm, and a flexible printed wiring board (FPC) was thus manufactured.

The width of the signal lines L100 was 100 µm, and the length was 100 mm. Wiring boards were obtained in which the remaining ratio of the ground layer 30 was changed among 100% (no removed portions), 75%, 55.6%, 43.8%, 36%, 30.6%, and 26.5%. In addition, wiring boards were obtained in which the ratio between each of the width of the first region corresponding to the first signal line L110 and the width of the second region corresponding to the second signal line L120 and each width of the signal lines L110 and L120 was changed among 1, 2, 3, 5, 7, and 9. Furthermore, wiring boards were manufactured by way of trial with the circuit width changed at 10 µm intervals between 80 to 400 µm, among which a wiring board having a characteristic impedance $Z_0$ of 50Ω was selected and the transmission speed ratio $v/v_0$ was calculated.

In the present working example, the transmission speed in the signal lines L100 was measured using TDR (Sampling Oscilloscope TDS8200 and TDR Module 80E40 both available from Tektronix, Inc). Time for a TDR waveform is supposed to be 2t from the interface between the probe and the FPC to an open end. Time required for a signal to pass through a sample is t because a reflected voltage waveform is measured in TDR. When the measured time for 100% of the remaining ratio of the ground layer 30 (no removed portions) is $t_0$, the transmission speed $V_0$ of the signal is represented by $V_0=L/t_0$. Here, L is the length of the sample. Similarly, the transmission speed V of a signal for each remaining ratio of the ground layer 30 is represented by V=L/t. The transmission speed ratio is defined as $V/V_0$.

The relationship between design indices for the mesh structure and the transmission speed ratio is shown in FIG. 5. The design indices for the mesh structure include the remaining ratio of the ground layer 30, the circuit width ML to form the grid pattern, and the width MS of the partial regions from which the conductor has been removed. Here, the transmission speed ratio $V/V_0$ refers to a ratio of the transmission speed V in each wiring board to the transmission speed $V_0$ in the wiring board having no removed portions of the ground layer 30. The transmission speed ratio $V/V_0$ was measured for each of grand extraction widths P10 to P16, or each D. The grand extraction width refers to a region corresponding to the region D (D1, D2) from which portions of the ground layer 30 are extracted (removed) to configure the mesh structure having a predetermined remaining ratio. In the present embodiment, the region corresponding to the region D (D1, D2) to be formed with the mesh structure having a predetermined remaining ratio was defined by a natural number multiple of the circuit width L (L1, L2) of the signal line.

As shown in FIG. 5, as the remaining ratio of the ground layer 30 decreases, the transmission speed ratio increases. That is, the transmission speed increases. Note that FIG. 5 shows examples of a combination of the circuit width ML to achieve the mesh structure (inclined grid pattern) of each remaining ratio and the width MS of partial regions from which the conductor has been removed, but the present invention is not limited thereto.

According to the present embodiment, as shown in FIG. 5, the circuit width of the signal lines L100 can be widened (increased) thereby to increase the transmission speed ratio in a state in which the impedance $Z_0$ is kept at $Z_0$=50Ω. That is, the transmission speed can be increased with a fixed impedance.

Moreover, as shown in the figure, as the extraction width of the ground layer 30 (width of the region D) increases, the amount of variation in the transmission speed ratio decreases. FIG. 6 shows a relationship between the ratio of the extraction width of the ground layer 30 (width of the region D) to the circuit width of the signal line and the transmission speed ratio. In order to keep constant the transmission speed ratio, it is preferred that the extraction width of the ground layer 30, i.e., the width of the region D defined based on the signal lines L100, is three times or more of the circuit width L of the signal lines L100. This can provide a wiring board having stable transmission characteristics.

As shown in FIGS. 5 and 6, the remaining ratio of the ground layer 30 can be reduced thereby to increase the transmission speed. According to the present embodiment, the remaining ratio of the ground layer 30 corresponding to the first signal line L110 provided outside at the curved portion can be relatively reduced to adjust the transmission speed, thereby eliminating the delay in transmission time due to the physical length of the signal line being long.

As shown in FIGS. 5 and 6, the circuit width L of the signal line can be increased thereby to increase the transmission speed while keeping constant the impedance.

According to the present embodiment, the circuit width of the first signal line L110 provided outside at the curved portion can be relatively increased thereby to eliminate the delay in transmission time due to the physical length of the first signal line L110 being long, while keeping the impedance at a predetermined value.

As shown in FIGS. 5 and 6, the extraction width of the ground layer 30 (first region, second region) can be set three times or more of the circuit width L of the signal lines L100 thereby to keep constant the transmission speed ratio.

In the first embodiment, the remaining ratio of the ground layer 30 has been described using the signal lines L100 in a straight form for illustrative purposes. The circuit width L of the signal lines L100 and the remaining ratio of the ground layer 30 as described in the first embodiment may be controlled at curved portions at which the extending direction of the signal lines L100 varies, or may also be controlled at straight portions which merge into the curved portions or at straight portions which are independent of the curved portions.

Second Embodiment

With reference to FIG. 7A to FIG. 10, the second embodiment will hereinafter be described. A printed wiring board 1 according to the second embodiment has a different feature that the mesh structure of the ground layer 30 is configured of a longitudinal grid pattern. Basic features and actions of the second embodiment are common with those of the first embodiment. Here, to avoid repetition in descriptions, descriptions for the common features are borrowed from those for the first embodiment.

Figure 7A:
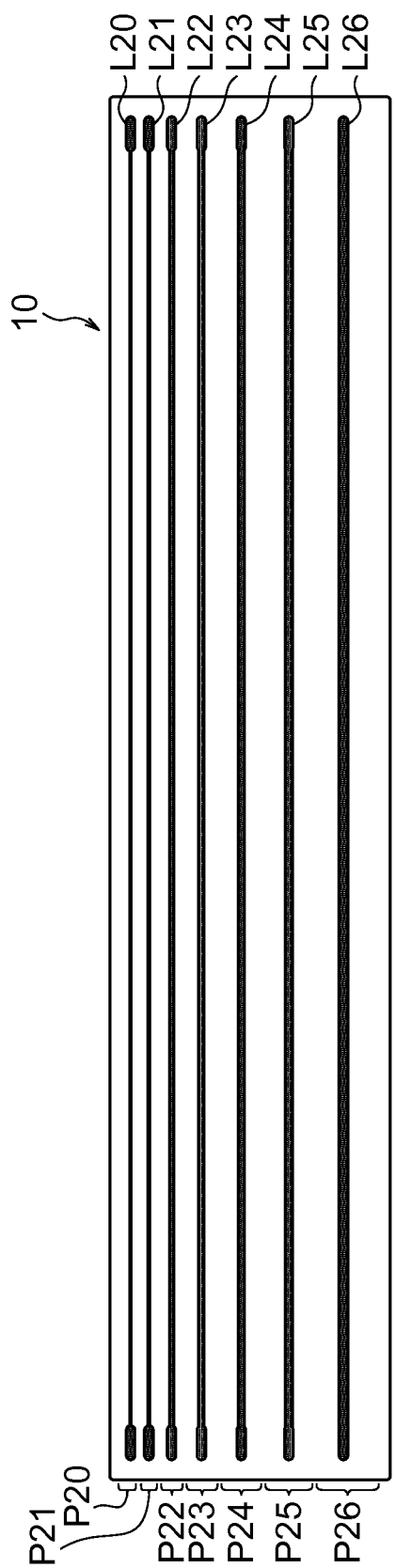
FIG. 7A is a plan view of an insulating substrate of which one main surface is formed with signal lines according to a second embodiment of the present invention, and shows examples of signal lines having different widths.
Figure 7B:
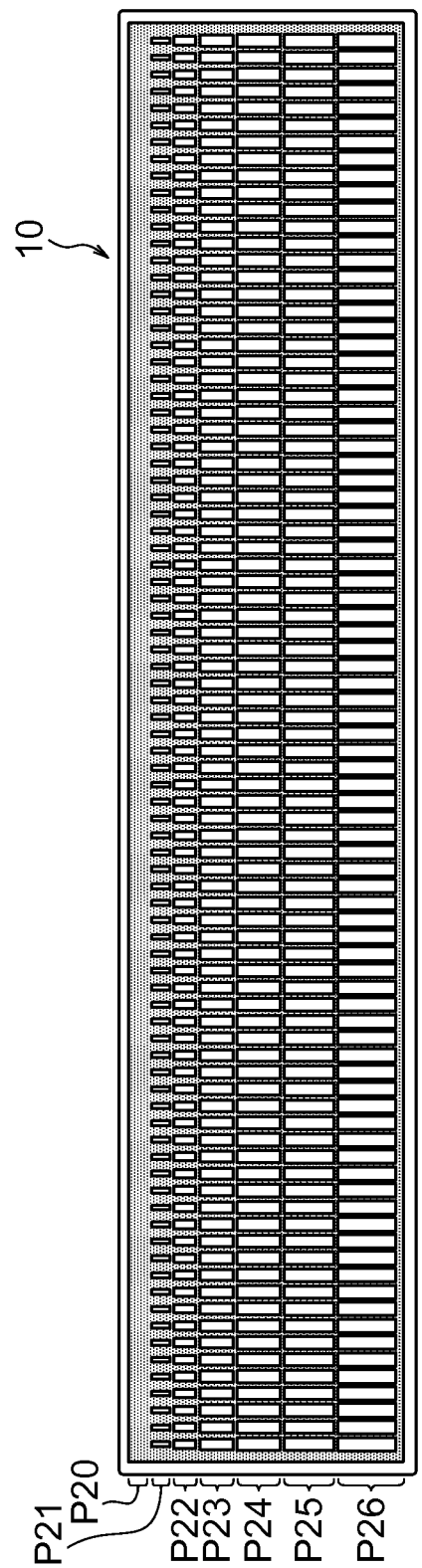
FIG. 7B is a plan view of the lower surface side of the insulating substrate shown in FIG. 7A, and shows an example of a ground layer in which the remaining ratio and the region width vary.
Figure 7C:
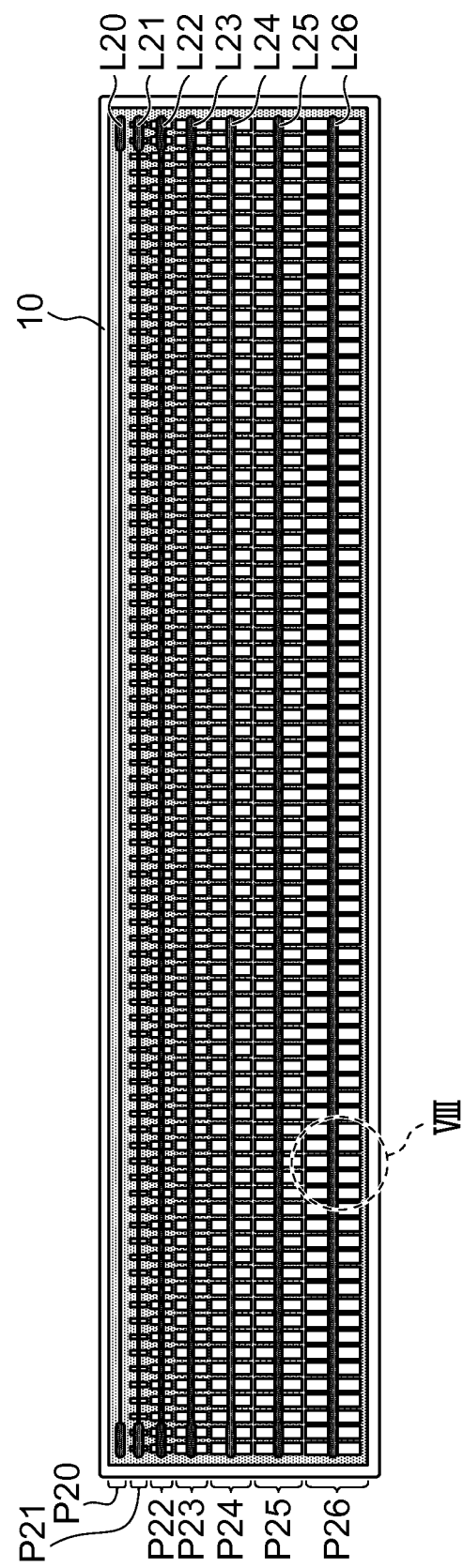
FIG. 7C is a plan view of the insulating substrate shown in FIG. 7A viewed from the side of the one main surface provided with the signal lines, but with the ground layer on the other main surface being transparently viewed.

FIG. 7A is a plan view, viewed from the side of one main surface, of an insulating substrate 10 formed with model signal lines L20 to L26 in the second embodiment. FIG. 7B is a plan view, viewed from the side of the other main surface, of the insulating substrate 10 formed with a ground layer 30 of a longitudinal grid pattern. FIG. 7C is a plan view of the insulating substrate 10 viewed from the side of the one main surface like in FIG. 7A, but with the ground layer 30 on the other main surface being transparently viewed. As shown in FIG. 7C, the model signal lines L20 to L26 are associated with regions P20 to P26 having respective predetermined widths based on the model signal lines L20 to L26. The remaining ratio of the ground layer 30 is varied for each region D corresponding to each of the regions P20 to P26.

Figure 8:
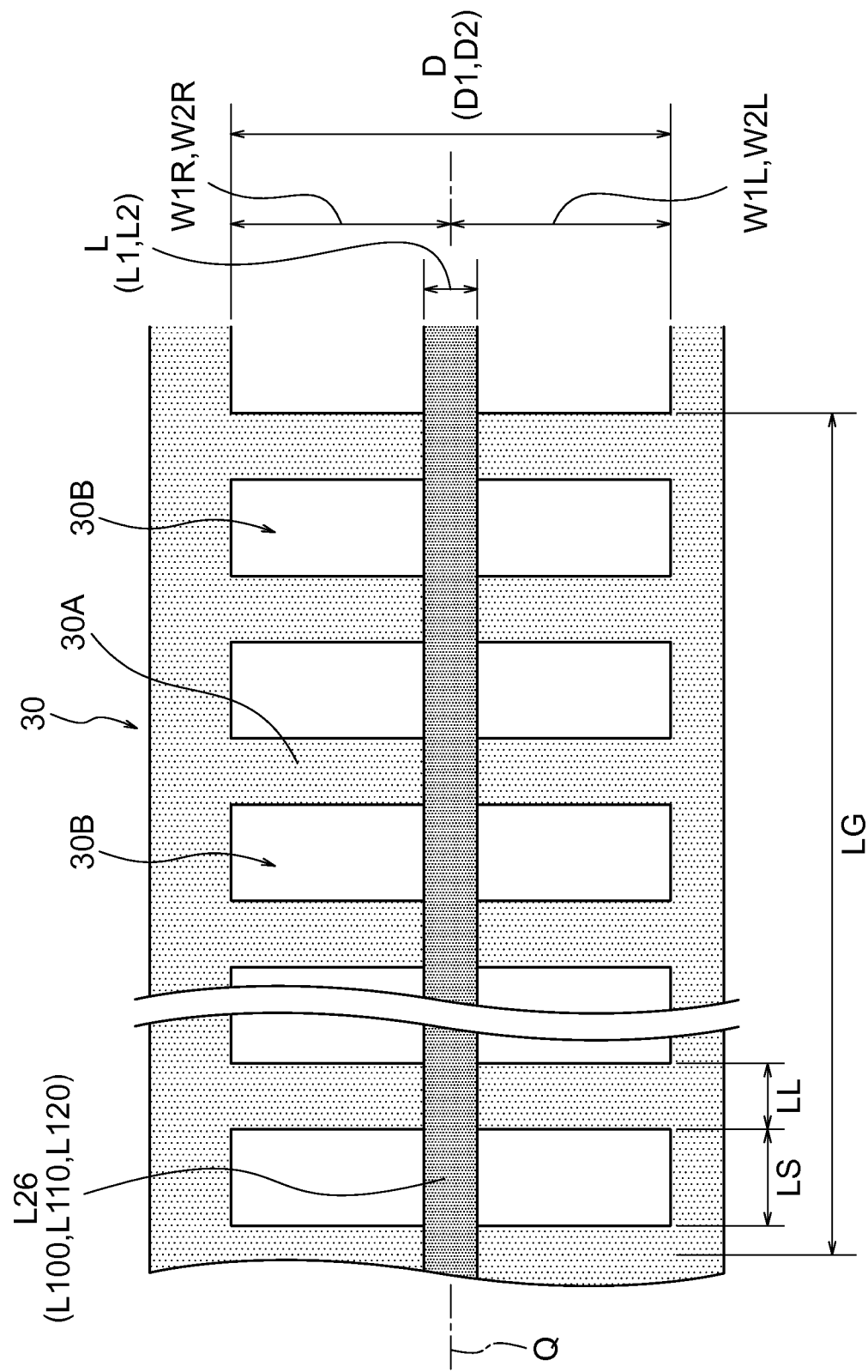
FIG. 8 is an enlarged view of region VIII shown in FIG. 7C.

FIG. 8 is an enlarged view of region VIII shown in FIG. 7C. The ground layer 30 shown in FIG. 8 has a mesh structure of a longitudinal grid pattern in which a plurality of partial regions 30A are discretely removed so that the remaining region 30B constitutes the mesh structure.

Descriptions regarding the model signal lines L20 to L26 can be applied to the signal lines L100 according to the present embodiment and the first signal lines L110 and the second signal lines L120 included in the signal lines L100.

Also in the ground layer 30 having a mesh structure of a longitudinal grid pattern according to the present embodiment, the ground layer 30 is formed such that the remaining ratio of a first ground layer 30 corresponding to a first region D1 is lower than the remaining ratio of a second ground layer 30 corresponding to a second region D2. The first region D1 is defined based on the position of each first signal line L110 and has first predetermined widths W1R and W1L. The second region D2 is defined based on the position of each second signal line L120 and has second predetermined widths W2R and W2L.

Referring to FIG. 8, the remaining ratio of the ground layer 30, the predetermined regions, and the method of calculating them when the ground layer 30 has a mesh structure of a longitudinal grid pattern are basically common with those in the method of calculation in the first embodiment. In the present embodiment, the remaining ratio of the ground layer 30 is calculated based on a circuit width LL to form the grid pattern shown in FIG. 8 and a width LS of partial regions from which the conductor has been removed. That is, the remaining amount of the ground layer 30 is calculated from the circuit width LL to form the grid pattern, and the removal amount of the ground layer 30 is calculated from the width LS of the partial regions.

Specifically, in the present embodiment, the remaining ratio of the ground layer 30 can be obtained using Equation 2 below.

$$\text{Remaining ratio}[\%] = \{LL/(LL+LS)\} \times 100 \quad (2)$$

As shown in FIG. 8, the ground layer 30 in which the remaining ratio is controlled is provided to correspond to the region D having a width that is defined by the predetermined widths W1R and W1L based on the position Q of each signal line L100.

Each printed wiring board 1 according to a second working example of the second embodiment was manufactured under the same conditions as those in the first working example of the first embodiment. The second working example is different in that the mesh structure of the ground layer 30 is a longitudinal grid pattern, but other conditions are common with those in the first working example. FIG. 9 shows a relationship between the transmission speed ratio and the remaining ratio of the ground layer 30, and FIG. 10 shows a relationship between the ratio of the extraction width of the ground layer 30 to the circuit width of the signal line and the transmission speed ratio. The tendency in the relationship between design indices for the mesh structure and the transmission speed ratio as shown in FIG. 9 and FIG. 10 is common with the result of the first working example shown in FIG. 5. Thus, also in the case of the mesh structure of a longitudinal grid, similar actions and effects to those in the first working example can be achieved.

Third Embodiment

With reference to FIG. 11A to FIG. 14, the third embodiment according to the present invention will be described.

In the first and second embodiments, descriptions have been made for a method in which the remaining ratio of the ground layer 30 is controlled to adjust the transmission speeds in a pair of signal lines thereby to suppress the occurrence of a difference in transmission time in the signal lines. In the present embodiment, descriptions will be made for an example in which the above method of suppressing the occurrence of a difference in transmission time is applied to a printed wiring board 1 comprising signal lines L100 having different lengths. Specifically in the present embodiment, descriptions will be made for an example in which the above method is applied to a printed wiring board 1 comprising a first signal line 110 and a second signal line 120 that have different lengths due to having curves. In the present example, descriptions will be made for the printed wiring board 1 comprising the first signal line 110 and the second signal line 120 which have different lengths due to arrangement at the curved portions, but the causes of different lengths of the first signal line 110 and the second signal line 120 are not limited thereto. Causes of different lengths of the first signal line 110 and the second signal line 120 in the printed wiring board 1 according to the present embodiment may be the presence or absence of a curve or curves, difference in the curve shape, difference in positions of the signal input ends and signal output ends, or difference in the wiring patterns.

Figure 11A:
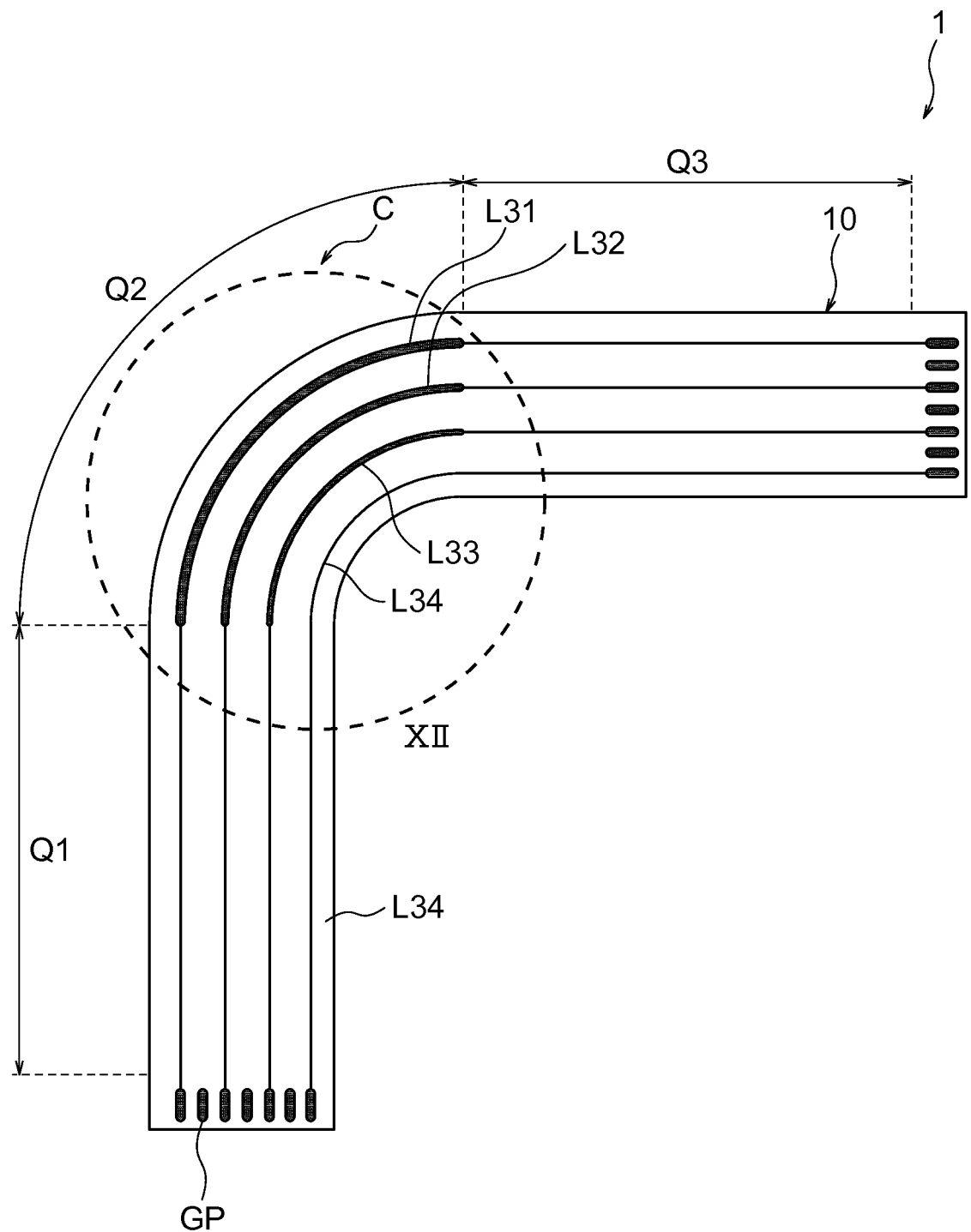
FIG. 11A is a plan view of an insulating substrate of which one main surface is formed with curved portions of signal lines according to a third embodiment of the present invention, and shows examples of signal lines having different widths.
Figure 11B:
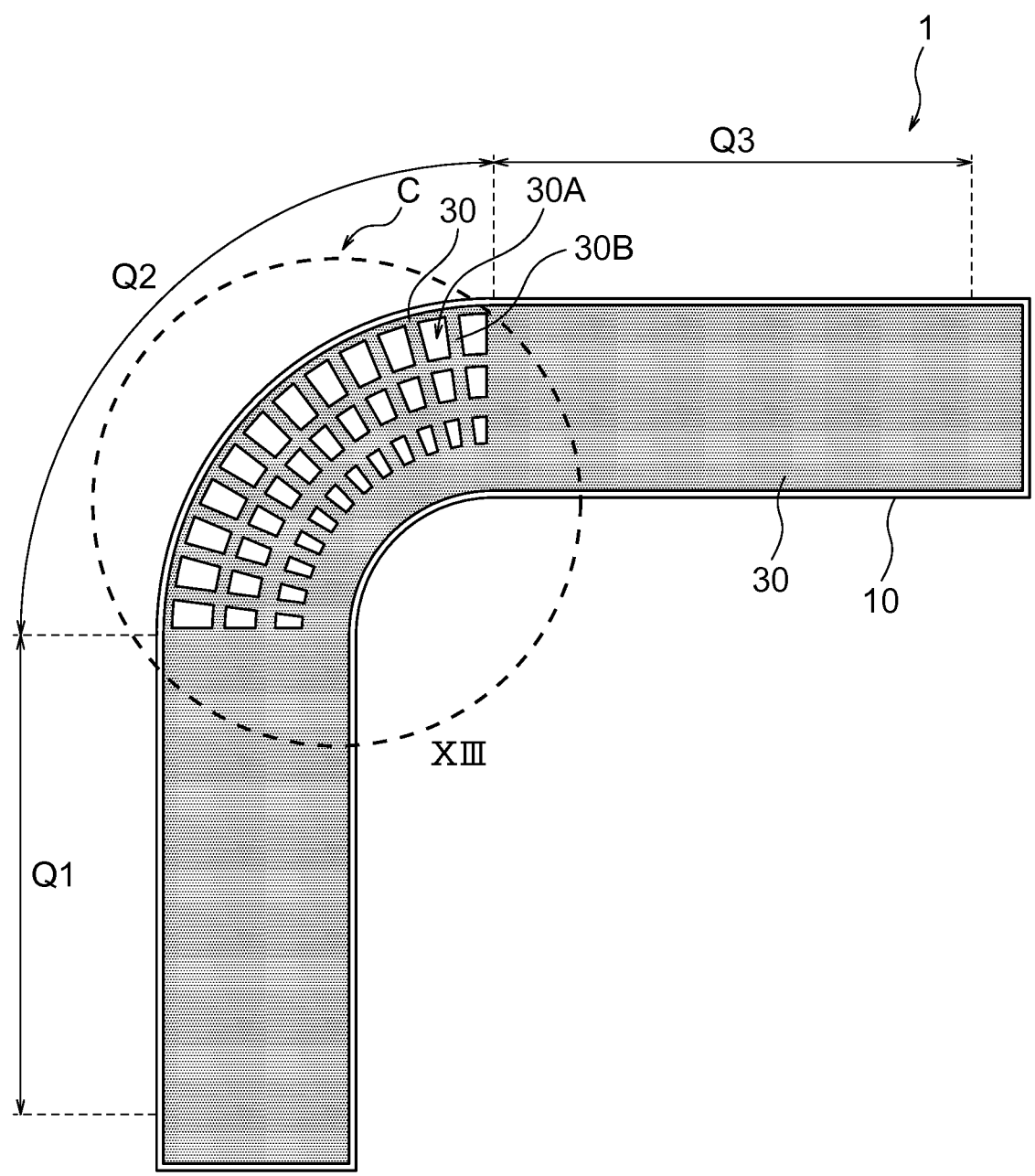
FIG. 11B is a view when the lower surface side of a ground layer is transparently viewed through the insulating substrate from which the signal lines shown in FIG. 11A are removed, and shows an example of the ground layer in which the remaining ratio and the region width vary.
Figure 11C:
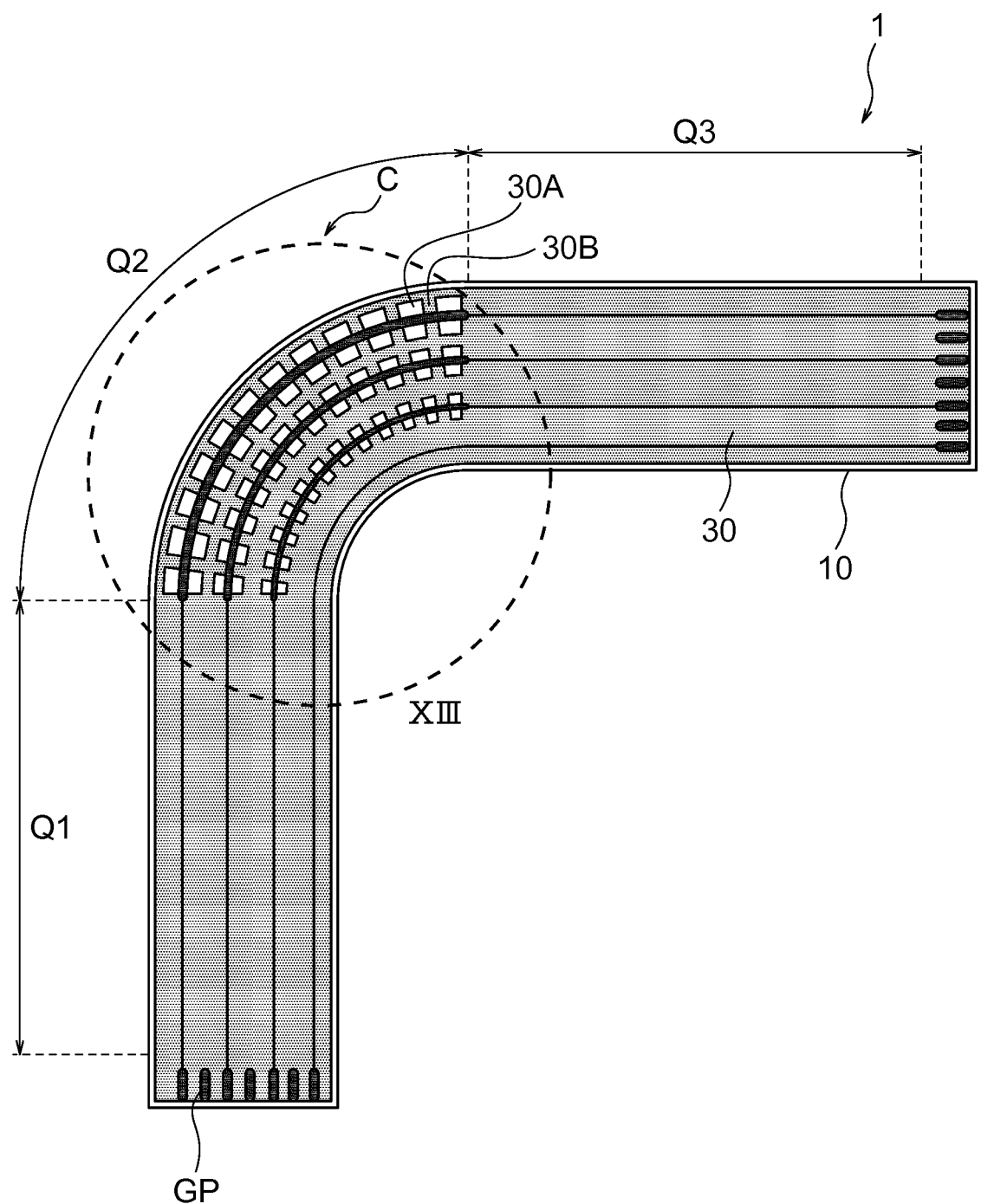
FIG. 11C is a plan view of the insulating substrate shown in FIG. 11A viewed from the side of the one main surface provided with the signal lines, but with the ground layer on the other main surface being transparently viewed.

The printed wiring board 1 shown in FIG. 11A to FIG. 11C comprises signal lines L100 that include portions within a curved area C and portions within straight-line areas Q1 and Q3 merging into the curved area C. The shape of the printed wiring board 1 according to the present embodiment is not limited to that shown in the figure, and may also be configured such that the curved area C is independent of the straight-line areas Q1 and Q3, or other shapes of signal lines are formed between the curved area C and the straight-line areas Q1 and Q3. Basic parts of the printed wiring board 1 in the third embodiment are common with those of the printed wiring board 1 in the first and second embodiments. Here, to avoid repetition in descriptions, descriptions for the common matters are borrowed from those for the first and second embodiments.

FIG. 11A is a plan view, viewed from the side of one main surface, of an insulating substrate 10 formed with four signal lines L31 to L34. As shown in the figure, each of the signal lines L31 to L34 has a curved portion within the curved area C at which the extending direction varies. Hereinafter, signal lines in the third embodiment will also be referred to as "signal lines L100" in a collective term. As shown in the figure, the signal lines L31 to L34 in the present example each have a curvature in the area Q2. In FIG. 11A, parts of the signal lines L31 to L34 located in the area Q2 form the curved area C. The signal lines L31 to L34 have portions with no curvatures within the area Q1 that merges into the area Q2 (curved area C) at the upstream side. In addition, the signal lines L31 to L34 have portions with no curvatures within the area Q3 that merges into the area Q2 (curved area C) at the downstream side. The areas Q1 and Q3 shown in FIG. 11A are the straight-line areas.

FIG. 11B is a view when the lower surface side of the ground layer is transparently viewed through the insulating substrate from which the signal lines shown in FIG. 11A are removed, and shows an example of the ground layer in which the remaining ratio and the region width vary. In other words, FIG. 11B is a plan view when the lower surface side of the ground layer 30 of a grid pattern is transparently viewed from the side of the insulating substrate 10. As shown in FIG. 11B, the remaining ratio of the ground layer 30 and the width of a region in which the ground layer 30 with the controlled remaining ratio is formed can be varied.

FIG. 11C is a plan view of the insulating substrate 10 viewed from the side of the one main surface like in FIG. 11A, but with the ground layer 30 on the other main surface being transparently viewed. FIG. 11C represents the positional relationship between the signal lines L31 to L34 and the ground layer 30.

FIG. 12 is an enlarged view of region XII shown in FIG. 11A. As shown in FIG. 12, each of signal lines L31 to L34 has a curvature determined based on the center X of curvature. According to the present embodiment, the first signal line L31 is configured to have a larger circuit width than that of the second signal line L32 in view of impedance matching. In addition, as shown in FIG. 12, in the signal lines L31 to L34 provided side by side with one another in the curved area C, the circuit width of the signal line L33 provided outside at the curved portion is set larger than the circuit width of the signal line L34 provided inside at the curved portion (provided at the side of the center X of curvature). Furthermore, the circuit width of the signal line L32 provided outside at the curved portion is set larger than the circuit width of the signal line L33, and the circuit width of the signal line L31 provided outside at the curved portion is set larger than the circuit width of the signal line L32. This allows the transmission speed to be controlled while ensuring impedance matching among the signal lines L31 to L34.

Figure 13:
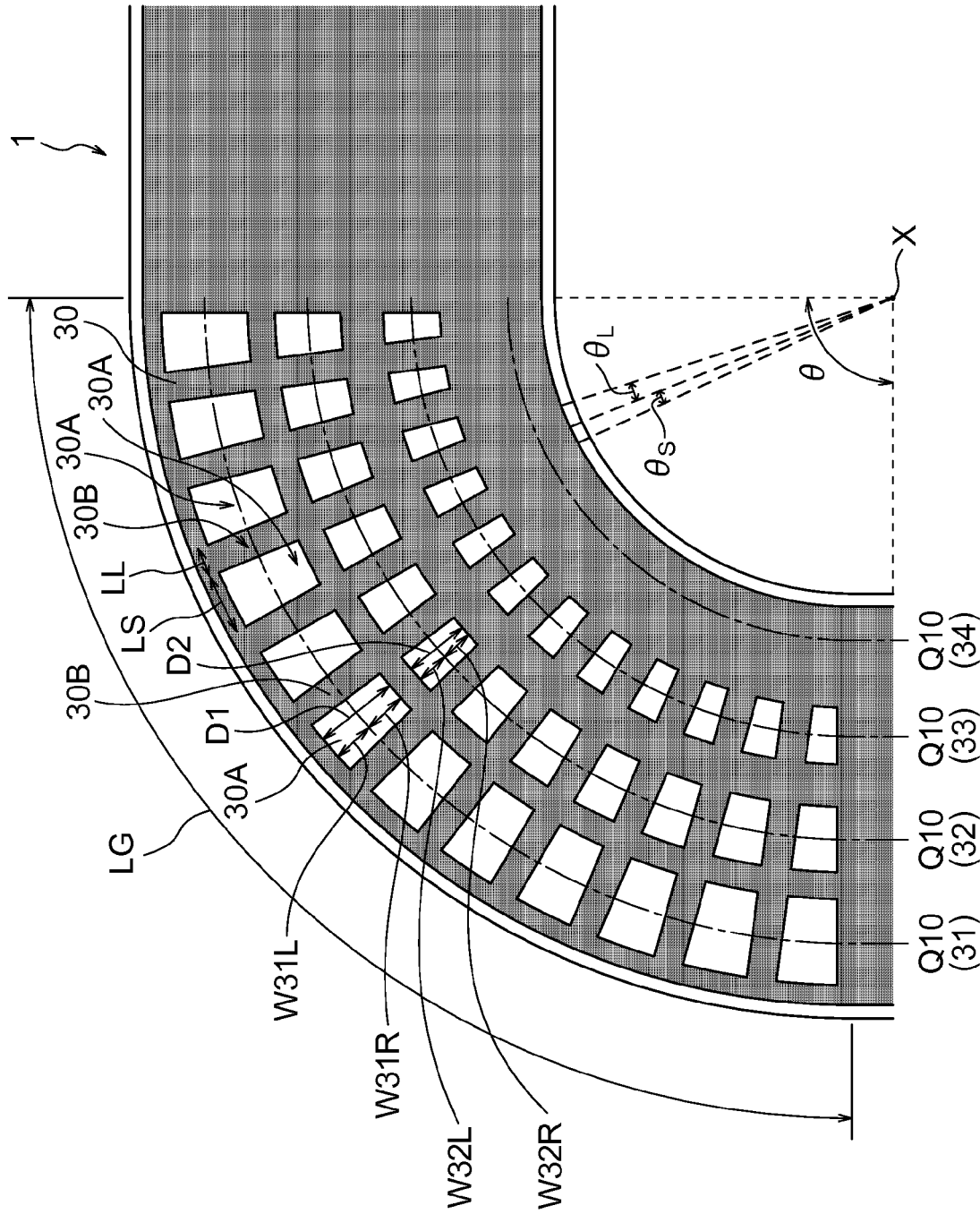
FIG. 13 is an enlarged view of region XIII shown in FIG. 11B.

FIG. 13 is an enlarged view of region XIII shown in FIG. 11B. The ground layer 30 shown in FIG. 13 has a mesh structure of a sector-shaped grid pattern in which a plurality of partial regions 30A are discretely removed so that the remaining region 30B constitutes the mesh structure. Dashed line Q10 (31) shown in FIG. 13 represents a reference position based on the position of the first signal line L31 which is provided relatively outermost. As shown in the figure, a first region D1 is defined by a right-side first predetermined width W31R and a left-side first predetermined width W31L on the basis of the position Q10 (31) corresponding to the first signal line L31. Dashed line Q10 (32) shown in FIG. 13 represents a reference position based on the position of the second signal line L32 which is provided relatively inside the first signal line L31. A second region D2 is defined by a right-side second predetermined width W32R and a left-side second predetermined width W32L on the basis of the position Q10 (32) corresponding to the second signal line L32. A first ground layer 30 having a predetermined remaining ratio is formed to correspond to the first region D1 at the lower surface side of the insulating substrate 10. A second ground layer 30 having a predetermined remaining ratio is formed to correspond to the second region D2 at the lower surface side of the insulating substrate 10.

The first region D1 may be defined across both of right side and left side of the first signal line L31, or may otherwise be defined at either of right side or left side of the first signal line L31. The first predetermined width W31R at the right side of the first signal line L31 may have a different value from that of the first predetermined width W31L at the left side of the first signal line L31. The second region D2 may be defined across both of right side and left side of the second signal line L32, or may otherwise be defined at either of right side or left side of the second signal line L32. The second predetermined width W32R at the right side of the second signal line L32 may have a different value from that of the second predetermined width W32L at the left side of the second signal line L32. When the distance between the first signal line L31 and the second signal line L32 adjacent to each other is small, one of the right side and the left side is provided with a narrow region while the other is provided with a wide region.

According to the present embodiment, the ground layer 30 is formed such that the remaining ratio of the first ground layer 30 corresponding to the first region D1 is lower than the remaining ratio of the second ground layer 30 corresponding to the second region D2. Again, the first region D1 is defined based on the position of the first signal line L31 and has the first predetermined widths W31R and W31L, while the second region D2 is defined based on the position of the second signal line L32 and has the second predetermined widths W32R and W32L. The remaining ratio of the ground layer 30 can be controlled by a removal amount (removal ratio) of a conductor, such as copper, which functions as ground, like in the first and second embodiments.

With reference to FIG. 13, a method of calculating the remaining ratio of the ground layer 30 when the ground layer 30 has a mesh structure of a sector-shaped grid pattern will be described. In the present embodiment, the remaining ratio of the ground layer 30 is defined as a ratio of a surface area occupied by the region 30B (light gray part in the figure) in which the conductor exists to the total surface area of a predetermined region of the insulating substrate 10 formed with the ground layer 30, i.e., the total of the region 30 B in which the conductor exists and the regions 30A from which the conductor has been removed. The predetermined region D for which the remaining ratio of the ground layer 30 is to be controlled is defined by a length LG along the extending direction of the signal line and a predetermined width along the width direction of the signal line. The length LG along the extending direction of the signal line in the present embodiment is defined in accordance with a length of the curved portion having a curvature. The predetermined width is defined by the first predetermined widths W31R and W31L on the basis of the position Q10 (31) at which the signal line is provided.

In the present embodiment, the remaining ratio of the ground layer 30 is calculated based on a circuit width LL to form the sector-shaped grid pattern shown in FIG. 13 and a width LS of the partial regions from which the conductor has been removed. That is, the remaining amount of the ground layer 30 is calculated from the circuit width LL to form the sector-shaped grid pattern, and the removal amount of the ground layer 30 is calculated from the width LS of the partial regions. In the present example, when the distance from the center X of the curved portion (center of curvature) to the center of the signal line L31 (position on Q10 (31) in the figure) or the center of the signal line L32 (position on Q10 (32) in the figure) is represented by a bend radius (curvature radius) R, the center angle to form the region corresponding to the circuit width LL that forms the sector-shaped grid pattern is represented by $\theta_L$, and the center angle to form the region corresponding to the width LS of the partial regions is represented by $\theta_S$, the circuit width LL and the width LS of the partial regions can be calculated as below:

$$LL = R \times \theta_L; \text{ and}$$

$$LS = R \times \theta_S.$$

The remaining amount of the ground layer 30 is calculated from the circuit width LL to form the sector-shaped grid pattern, and the removal amount of the ground layer 30 is calculated from the width LS of the partial regions.

Specifically, in the present embodiment, the remaining ratio of the ground layer 30 can be obtained using Equation 3 below:

$$\text{Remaining ratio}[\%] = \{LL/(LL+LS)\} \times 100 \quad (3),$$

where $LL = R \times \theta_L$ and $LS = R \times \theta_S$.

In the third embodiment, a printed wiring board 1 was manufactured under the same conditions as those in the first and second working examples. Thereafter, the relationship between the transmission speed ratio and the remaining ratio of the ground layer 30 was measured. The printed wiring board 1 is different in that the signal lines L100 have a curved area C and the ground layer 30 corresponding to the region D also has a curved area C, but other conditions are common with those in the first and second working examples. The tendency in the relationship between design indices for the mesh structure and the transmission speed ratio was common with those in the first and second working examples shown in FIG. 5 and FIG. 9. It has thus been found that, also in the printed wiring board 1 having the curved area C, similar actions and effects to those in the first and second working examples can be achieved.

Similarly, a printed wiring board 1 was manufactured, under the same conditions as those in the first and second working examples, such that the signal lines L100 would have a curved area Q2 (C) and straight-line areas Q1 and Q3, and the ground layer 30 would also have a curved area Q2 (C) and straight-line areas Q1 and Q3. Thereafter, the relationship between the transmission speed ratio and the remaining ratio of the ground layer 30 was measured. The tendency in the relationship between design indices for the mesh structure of the printed wiring board 1 and the transmission speed ratio was common with those in the first and second working examples shown in FIG. 5 and FIG. 9. It has thus been found that, also in the printed wiring board 1 having the curved area Q2 (C) and the straight-line areas Q1 and Q3, similar actions and effects to those in the first and second working examples can be achieved. The method of defining the first region D1 and the second region D2 of each of the straight-line areas Q1 and Q2 is common with the method of defining the first region D1 and the second region D2 of the curved area Q (C).

Hereinafter, a third working example according to the third embodiment will be described.

For a pair of signal lines L100 for signaling, the wiring interval and other factors were adjusted to provide each characteristic impedance of 50Ω and the impedance when performing signaling of 90Ω, and a printed wiring board 1 having a form as shown in FIG. 11A to FIG. 13 was manufactured as Working Example 3.

For the plurality of signal lines L100 of the printed wiring board 1 according to the present working example shown in FIG. 12 and FIG. 13, the length of the inside signal line L34 was set to $l_1$, and the length of the outside signal line L33 was set to $l_2$. The bending angle corresponding to the curved portions was set to $\theta$. The difference $\delta l$ between the lengths $l_1$ and $l_2$ and the transmission speed ratio $v/v_0$ corresponding to the difference $\delta$ can be calculated using Equations 4 below:

$$l_1 = \theta R;$$

$$l_2 = \theta\{R+(L+S)\};$$

$$\delta l = l_2 - l_1 = \theta L + S); \text{ and}$$

$$v/v_0 = l_2/l_1 = (R+L+S)/R = 1+(L+S)/R \quad (4),$$

where L is the circuit width, S is the circuit interval, R is the bending radius of the inside wiring, and $\theta$ is the bending angle.

In the present working example, the circuit width L of a straight portion of the signal lines L100 was 0.08 mm, the circuit interval S was 0.1 mm, and the remaining ratio of the ground layer 30 was 100% (no removed regions). The bending radius R (distance from the center X of curvature) of a representative signal line of the signal lines L100 was 5 mm.

Since the speed ratio in the printed wiring board 1 of the present working example can be calculated using Equations 5 below, the remaining ratio of the ground layer 30 corresponding to the first region D1 based on the position of the outside signal line L34 is calculated so that the calculated speed ratio is obtained.

$$v/v_0 = l_2/l_1 = (R+L+S)/R = 1+(0.08+0.1)/5 = 1.036 \quad (5)$$

With reference to the "relationship between the remaining ratio of the ground layer 30 and the transmission speed ratio $v/v_0$" previously shown in FIG. 4 as one example, the remaining ratio of the ground layer 30 for each of the signal lines L100 is calculated on the basis of the transmission speed ratio $v/v_0$ calculated using the above equations.

In the present working example, the remaining ratio of the ground layer 30 corresponding to the second region D2 based on the position of the inside second signal line L34 was 100%, and the remaining ratio of the ground layer 30 corresponding to the first region D1 based on the position of the outside first signal line L33 was 79.2%. The circuit width L34 of the inside second signal line L34 was 80 µm, and the circuit width L33 of the adjacent outside first signal line L33 was 90 µm. This can suppress the occurrence of a difference in transmission time between the pair of signal lines L34 and L33. In the present working example, the remaining ratio of the ground layer 30 corresponding to the second region D2 based on the position of the second signal line L34 was 100%, but the present invention is not limited thereto.

For the printed wiring board 1 of Working Example 3 shown in FIG. 11A to FIG. 13, the remaining ratio of the ground layer 30 corresponding to each of the signal lines 31 to 34 was calculated. Calculated values are shown in FIG. 14. In the present working example, the remaining ratio of each portion of the ground layer 30 was calculated so that a difference in transmission time would not occur among all of the signal lines 31 to 34.

In the third working example, as shown in FIG. 14, the remaining ratio of the ground layer 30 was sequentially reduced in the order of the signal line L34 provided innermost at the curved portion, the signal line L33 provided outside the signal line L34, the signal line L32, and the signal line L31 provided outermost at the curved portion. This allowed the transmission speed to be adjusted in each of the signal lines 31 to 34, and a difference in transmission time did not occur among all of the four signal lines 31 to 34. In the third working example, as shown in FIG. 14, the circuit width L of the signal line was sequentially increased from the signal line L34 provided innermost at the curved portion to the signal line L31 provided outermost at the curved portion. This allowed each of all of the four signal lines 31 to 34 to have the same impedance.

Thus, according to the present embodiment, a difference in transmission time can be suppressed from occurring in plural signal lines L100 regardless of the relationship between two of the signal lines L100. That is, the remaining ratio of the ground layer 30 corresponding to the region D defined based on the position of each of the signal lines L31 to L34 can be sequentially reduced from the inside to the outside of the curved portions, i.e., from the signal line L34 to the signal line L31, thereby to increase the transmission speed in the signal line L31 provided outside, so that it is possible to suppress the occurrence of a difference in transmission speed due to the difference in physical length among the plural signal lines L100. Moreover, the width of the signal lines L100 can be increased from the inside to the outside of the curved portions thereby to allow each of the signal lines L100 to have the same impedance. This can suppress the occurrence of common-mode noise among the signal lines L100.

Embodiments heretofore explained are described to facilitate understanding of the present invention and are not described to limit the present invention. Therefore, it is intended that the elements disclosed in the above embodiments include all design changes and equivalents to fall within the technical scope of the present invention.

1 . . . Printed wiring board
10 . . . Insulating substrate
20 . . . Protective layer
30 . . . Ground layer
L100, L110, L120, L10 to L16, L20 to L26, L31 to L34 . . . Signal line
C . . . Curved area
D, D1, D2, P11 to P16 . . . First region, Second region

What is claimed is:

1. A printed wiring board comprising:
an insulating substrate;
a first signal line formed on the insulating substrate;
a second signal line having a shorter length than a length of the first signal line; and
a ground layer comprising a first region and a second region, wherein
the first region is defined based on a position of the first signal line and has a first predetermined width,
the second region is defined based on a position of the second signal line and has a second predetermined width,
parts of the ground layer are removed in the first region and the second region, wherein a first ratio of a surface area of the ground layer remaining in the first region to a total surface area of the first region is lower than a second ratio of a surface area of the ground layer remaining in the second region to a total surface area of the second region, and
the first predetermined width of the first region is three times or more of a width of the first signal line, the second predetermined width of the second region being three times or more of a width of the second signal line.

2. The printed wiring board according to claim 1, wherein:
the first signal line comprises a first curved portion; and
the second signal line comprises a second curved portion that is provided inside the first curved portion of the first signal line.

3. The printed wiring board according to claim 1, wherein:
the first signal line comprises a straight portion; and
a third ratio of a surface area of the ground layer remaining in a third region to a total surface area of the third region corresponding to the straight portion of the first signal line is lower than a fourth ratio of a surface area of the ground layer remaining in a fourth region to a total surface area of the fourth region corresponding to a portion of the second signal line that is formed along the straight portion of the first signal line.

4. The printed wiring board according to claim 1, wherein the width of the first signal line is larger than the width of the second signal line.

5. The printed wiring board according to claim 1, wherein the first predetermined width of the first region is larger than the second predetermined width of the second region.

6. The printed wiring board according to claim 1, wherein each of the first region and the second region has a mesh structure in which the parts of the ground layer are discretely removed.

* * * * *